US009727175B2

(12) United States Patent
Salaverry

(10) Patent No.: US 9,727,175 B2
(45) Date of Patent: Aug. 8, 2017

(54) SYSTEM AND METHOD FOR DETECTING LOCATIONS OF TOUCHES ON A PROJECTED CAPACITIVE TOUCH SENSOR

(75) Inventor: Ricardo R. Salaverry, San Jose, CA (US)

(73) Assignee: Elo Touch Solutions, Inc., New York, NY (US)

( * ) Notice: Subject to any disclaimer, the term of this patent is extended or adjusted under 35 U.S.C. 154(b) by 701 days.

(21) Appl. No.: 12/780,077

(22) Filed: May 14, 2010

(65) Prior Publication Data
US 2011/0279169 A1 Nov. 17, 2011

(51) Int. Cl.
G06F 3/044 (2006.01)
G01R 27/26 (2006.01)
G06F 3/041 (2006.01)

(52) U.S. Cl.
CPC ......... *G06F 3/044* (2013.01); *G01R 27/2605* (2013.01); *G06F 3/0416* (2013.01); *G06F 2203/04104* (2013.01); *G06F 2203/04107* (2013.01); *G06F 2203/04108* (2013.01); *G06F 2203/04112* (2013.01)

(58) Field of Classification Search
USPC ........................................................ 324/662
See application file for complete search history.

(56) References Cited

U.S. PATENT DOCUMENTS

| | | | |
|---|---|---|---|
| 3,573,755 A | 4/1971 | Ellis et al. | |
| 3,697,687 A | 10/1972 | Larson et al. | |
| 4,087,625 A | 5/1978 | Dym et al. | |
| 4,504,832 A | 3/1985 | Conte | |
| 5,053,757 A | 10/1991 | Meadows | |
| 5,305,017 A * | 4/1994 | Gerpheide | 345/174 |
| 5,327,164 A | 7/1994 | Fagard et al. | |
| 5,606,346 A * | 2/1997 | Kai | G06F 1/1626 345/173 |
| 6,288,707 B1 | 9/2001 | Philipp | |
| 6,297,811 B1 | 10/2001 | Kent et al. | |

(Continued)

FOREIGN PATENT DOCUMENTS

| | | |
|---|---|---|
| CN | 101535933 A | 9/2009 |
| CN | 101566895 A | 10/2009 |

(Continued)

OTHER PUBLICATIONS

International Search Report and Written Opinion for PCT/US2011/036492, counterpart of the above-identified application).

(Continued)

*Primary Examiner* — Jeff Natalini
(74) *Attorney, Agent, or Firm* — Sterne, Kessler, Goldstein & Fox P.L.L.C.

(57) ABSTRACT

A projected capacitive touch sensor includes a substrate and sets of electrodes coupled to corresponding areas of the substrate. The areas are non-overlapping with respect to each other. The sets of electrodes include a horizontal sensing electrode that extends along a height of a first column within the area and vertical sensing electrodes that extend partially along the height of at least one column within the area. The at least one column includes at least two vertical sensing electrodes that are physically separate with respect to each other and electrically connected to each other.

20 Claims, 12 Drawing Sheets

(56) References Cited

U.S. PATENT DOCUMENTS

| | | | |
|---|---|---|---|
| 6,393,324 B2 * | 5/2002 | Gruzdowich | A61N 1/36007 607/41 |
| 6,879,930 B2 | 4/2005 | Sinclair et al. | |
| 7,196,358 B1 | 3/2007 | Chen | |
| 7,218,124 B1 | 5/2007 | Mackey et al. | |
| 7,382,139 B2 | 6/2008 | Mackey | |
| 7,439,962 B2 * | 10/2008 | Reynolds et al. | 345/173 |
| 7,567,240 B2 | 7/2009 | Peterson, Jr. et al. | |
| 2003/0067451 A1 | 4/2003 | Tagg et al. | |
| 2005/0184965 A1 | 8/2005 | Geaghan et al. | |
| 2005/0247559 A1 | 11/2005 | Frey et al. | |
| 2005/0270273 A1 * | 12/2005 | Marten | 345/173 |
| 2006/0274055 A1 | 12/2006 | Reynolds et al. | |
| 2006/0279548 A1 * | 12/2006 | Geaghan | 345/173 |
| 2007/0052690 A1 | 3/2007 | Roberts | |
| 2007/0132724 A1 | 6/2007 | Muranaka | |
| 2007/0257894 A1 | 11/2007 | Philipp | |
| 2008/0111795 A1 | 5/2008 | Bollinger | |
| 2008/0158167 A1 | 7/2008 | Hotelling et al. | |
| 2008/0265914 A1 | 10/2008 | Matsushima | |
| 2009/0135146 A1 | 5/2009 | Scholz | |
| 2009/0194344 A1 | 8/2009 | Harley et al. | |
| 2009/0237374 A1 | 9/2009 | Li et al. | |
| 2009/0267914 A1 | 10/2009 | Dews et al. | |
| 2009/0314621 A1 | 12/2009 | Hotelling | |
| 2010/0001973 A1 | 1/2010 | Hotelling et al. | |
| 2010/0090979 A1 | 4/2010 | Bae | |
| 2010/0110038 A1 | 5/2010 | Mo et al. | |
| 2010/0149108 A1 | 6/2010 | Hotelling et al. | |
| 2010/0188345 A1 | 7/2010 | Keskin et al. | |
| 2010/0328265 A1 | 12/2010 | Hotelling et al. | |
| 2011/0057669 A1 | 3/2011 | Xu | |
| 2011/0210934 A1 | 9/2011 | Lee et al. | |
| 2011/0279408 A1 | 11/2011 | Urano et al. | |
| 2011/0279409 A1 | 11/2011 | Salaverry et al. | |

FOREIGN PATENT DOCUMENTS

| | | |
|---|---|---|
| CN | 101632060 | 1/2010 |
| CN | 102226883 A | 10/2011 |
| EP | 2045698 A2 | 4/2009 |
| KR | 2008-0104108 A | 12/2008 |
| TW | 200837622 A | 9/2008 |

OTHER PUBLICATIONS

Office Action for U.S. Appl. No. 13/107,565; dated Oct. 29, 2013.
English Language Abstract of Chinese Patent Application Publication No. 101535933A, 1 page.
Office Action mailed Jan. 27, 2015, in Chinese Patent Application No. 201180034483.1 filed May 13, 2011.
Office Action mailed Jul. 30, 2014, in Taiwanese Patent Application No. 100116795.
Office Action mailed Sep. 7, 2015, in Chinese Patent Application No. 201180034483.1 filed May 13, 2011.

* cited by examiner

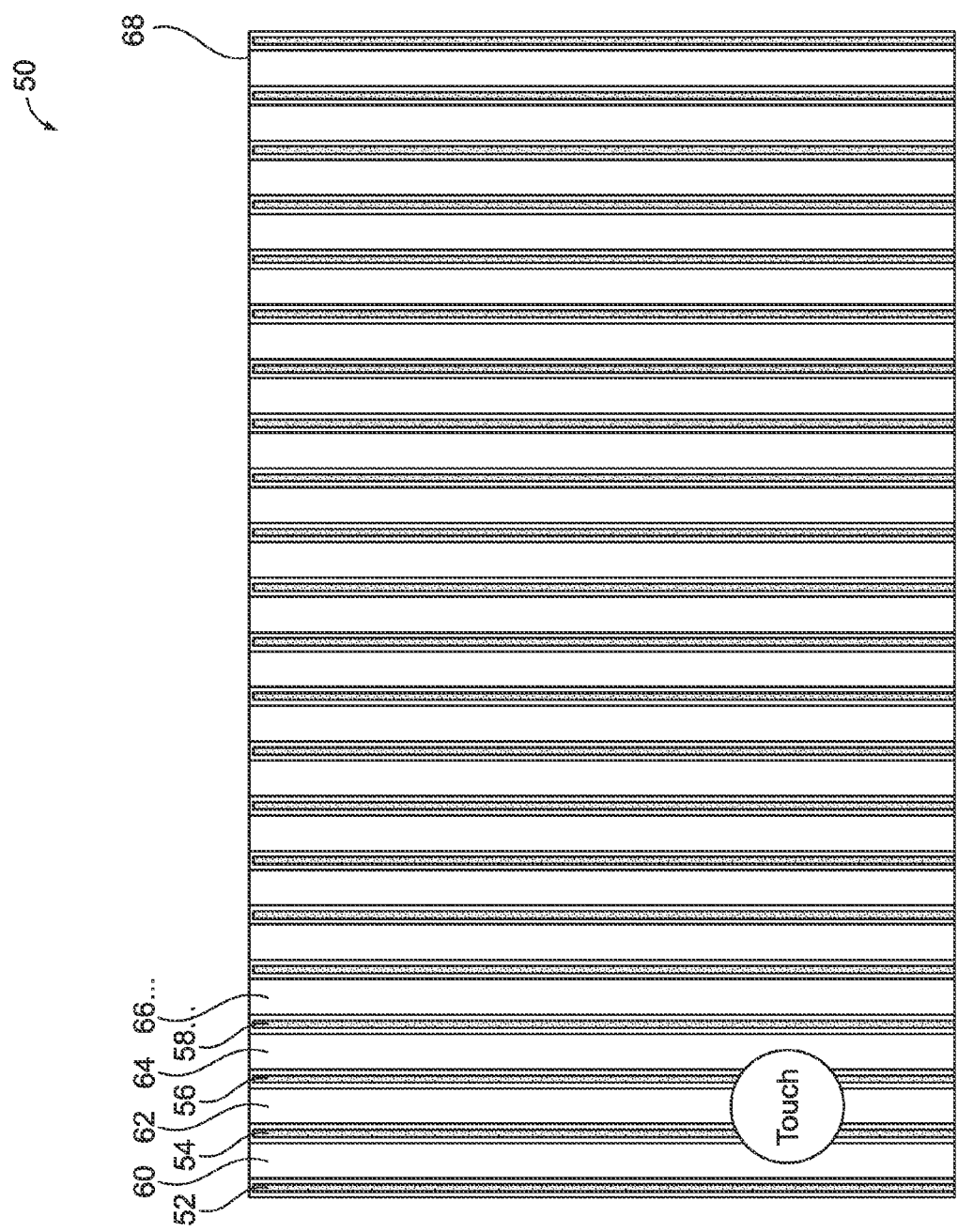

SYSTEM AND METHOD FOR DETECTING LOCATIONS OF TOUCHES ON A PROJECTED CAPACITIVE TOUCH SENSOR

BACKGROUND OF THE INVENTION

The subject matter disclosed herein relates generally to touch sensors and touch sensor systems, and more particularly to projected capacitive touch sensors.

In a projected capacitive touch sensor, an outer surface may be provided over one or more layers having sense electrodes or sensors formed thereon. In contrast to common resistive touch sensors, the outer surface of a projected capacitive touch sensor may be a durable glass surface having high optical transparency for viewing images displayed by an underlying display device. The touch sensor may be positioned over a display device that displays graphical selections such as buttons and icons. When a user's finger touches the outer surface at a location corresponding to a desired selection displayed on the display device, the touch sensor system senses a change in capacitance associated with one or more of the electrodes. As used herein, a "projected capacitive" touch sensor is any capacitive touch sensor with a plurality of sensing electrodes in the touch sensitive area, in contrast to a "surface capacitive" touch sensor that has a single sensing electrode that covers the entire touch area.

Some projected capacitive touch sensors detect where a touch is located by measuring capacitance and then calculating (X,Y) coordinates. These detection algorithms may not yield accurate results in electrically noisy environments.

Each touch on the projected capacitive touch sensor is typically detected by at least two electrodes. The number of electrodes may vary depending on the size of the screen as well as the resolution desired.

For example, one type of a projected capacitive touch sensor system may have two electrode layers: a first electrode layer having parallel linear electrodes in a first direction and a second separate electrode layer having parallel linear electrodes in a direction perpendicular to the first direction, where the second electrode layer overlaps the first electrode layer. Besides being expensive to manufacture with its multiple electrode layers, this type of projected capacitive touch sensor system can experience coordinate distortions resulting from electrical noise. The calculation of coordinates of a touch based on measured capacitance is susceptible to electrical noise. For instance, a 5% noise level may distort a coordinate measurement by about 5% of the width of a finger touch for this type of two-layer projected capacitive touch sensor. This level of distortion may be unacceptable for certain applications of the touch sensor.

Another type of a projected capacitive touch sensor system may have a "backgammon"-type electrode pattern configuration on a single layer containing two interleaved sets of generally triangular electrodes: one set ("set 1") with triangles pointing in one direction (e.g., up) and the other set ("set 2") with triangles pointing in the opposite direction (e.g., down), such as described in U.S. Pat. No. 6,297,811, which is incorporated herein by reference in its entirety. For such a backgammon-type system having a 3.5 inch diagonal measurement, the touch sensor may utilize close to fifty separate triangular-shaped electrodes on the single layer, and a seven-inch system may have more than one hundred electrodes. Even using a backgammon-type electrode configuration, the touch sensor may calculate coordinates after measuring capacitance, and is also susceptible to electrical noise, which may negatively impact the determination of coordinates. For example, a 5% noise level may distort a coordinate (e.g. Y coordinate) measurement by 5% of the entire height of the touch area, which may be unacceptable for many touch applications.

With such concerns due to the low noise level requirements, the electronics required for these conventional projected capacitive touch sensor systems may drive the overall system production costs up, especially for larger touch sensor systems.

Accordingly, there is a need for a low cost and higher noise-tolerant projected capacitive electrode touch sensor systems.

BRIEF DESCRIPTION OF THE INVENTION

In one embodiment, a projected capacitive touch sensor includes a substrate and sets of electrodes coupled to corresponding areas of the substrate. The areas are non-overlapping with respect to each other. The sets of electrodes include a horizontal sensing electrode that extends along a height of a first column within the area and vertical sensing electrodes that extend partially along the height of at least one column within the area. The at least one column includes at least two vertical sensing electrodes that are physically separate with respect to each other and electrically connected to each other.

In another embodiment, a projected capacitive touch sensor system includes a substrate, sets of electrodes coupled to corresponding areas of the substrate, and a controller. The areas are non-overlapping with respect to each other. The sets of electrodes include a horizontal sensing electrode that extends along a height of a first column within the area and vertical sensing electrodes that extend partially along the height of at least one column within the area. The at least one column includes at least two vertical sensing electrodes that are physically separate with respect to each other and electrically connected to each other. The controller detects signal levels associated with at least one touch on the substrate from the sets of electrodes. The signal levels associated with the horizontal sensing electrodes are used to determine the corresponding areas of the at least one touch and the signal levels associated with the vertical sensing electrodes are used to determine vertical locations within the corresponding areas of the at least one touch.

BRIEF DESCRIPTION OF THE DRAWINGS

FIGS. 2(a) and 2(b) illustrate a touch sensor wherein vertical and horizontal sensing electrodes are formed in a single plane on a surface of a touch sensor, in accordance with embodiments of the present invention.

DETAILED DESCRIPTION OF SPECIFIC EMBODIMENTS OF THE INVENTION

Figure 1:
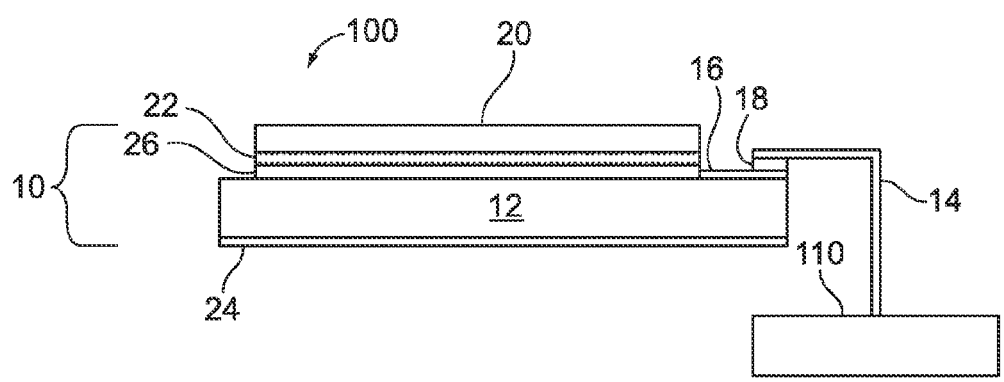
FIG. 1 illustrates a side-view of a projected capacitive touch sensor system formed in accordance with an embodiment of the present invention.

The foregoing summary, as well as the following detailed description of certain embodiments of the present invention, will be better understood when read in conjunction with the appended drawings. To the extent that the figures illustrate diagrams of the functional blocks of various embodiments, the functional blocks are not necessarily indicative of the division between hardware circuitry. Thus, for example, one or more of the functional blocks (e.g., processors or memories) may be implemented in a single piece of hardware (e.g., a general purpose signal processor or random access memory, hard disk, or the like). Similarly, the programs may be stand alone programs, may be incorporated as subroutines in an operating system, may be functions in an installed software package, and the like. It should be understood that the various embodiments are not necessarily drawn to scale or limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

FIG. 1 generally illustrates a side-view of a projected capacitive touch sensor 10 that may be used within a touch sensor system 100, according to a specific embodiment of the invention. A plurality of electrodes 26 on a single layer are attached to substrate 12 and may be coupled to a flexible cable 14 via interconnect traces 16, which may be metalized or other conductive traces, and a conductive adhesive bond 18, which may be an anisotropic conductive film (ACF). For example, termination pads within the interconnect traces 16 may be electrically connected to termination pads within the flexible cable 14 via an anisotropic conductive film. The flexible cable 14 is also coupled to the touch sensor electronics or a controller 110, which controls the driving and sensing of the electrodes as well as determining touch coordinates based on the sensed touch or touches to the sensor. A durable transparent layer of glass, polycarbonate or other suitable material forming touch surface 20 may be mechanically coupled to the electrodes 26, such as with an adhesive layer 22. The capacitance change resulting from a finger(s) touching the touch surface 20 can be measured and associated touch coordinates determined.

In one embodiment, a shield or guard electrode 24 may optionally be deposited on a bottom surface of the substrate 12, around an outer edge of the substrate 12, and/or formed in the same plane or surface of the substrate 12 as the electrodes 26. The guard electrode 24 may be used to minimize the effects of stray capacitances to objects around the perimeter of the touch sensor 10, such as metal associated with a bezel, other supporting structures or a display device placed behind the touch sensor 10 (all not shown), and to minimize the effects of stray capacitances between the electrodes 26. Alternatively, guard electrode 24, adhesive layer 22 and touch surface 20 may be absent and sensing electrodes 26 may be used to detect touches that are applied to the surface of the substrate 12 that is opposite to the electrodes 26. In some embodiments, the touch sensor 10 may be separate from a display, and thus substrate 12 and electrodes 26 may be opaque or semi-opaque.

Figure 2B:
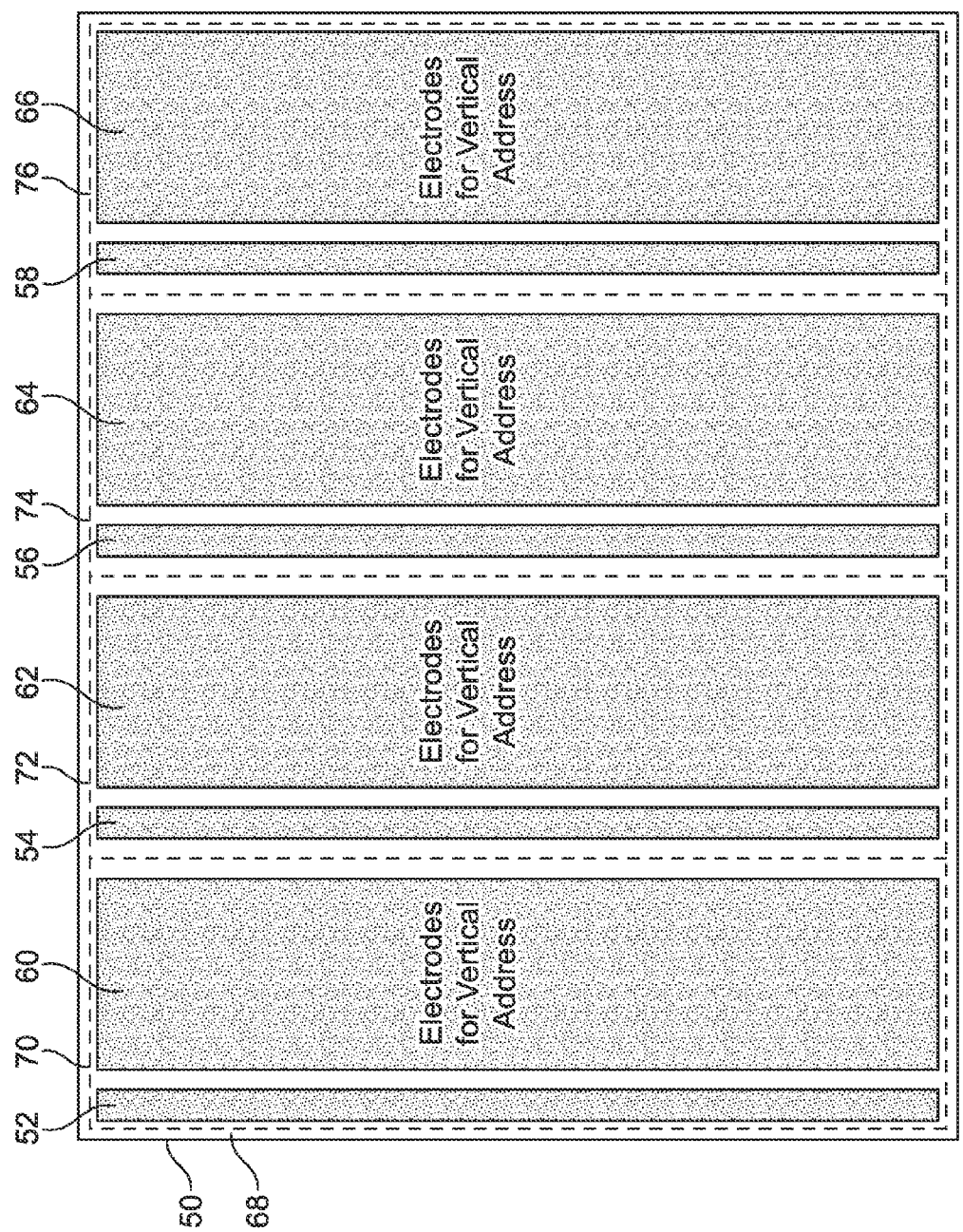

FIGS. 2(a) and 2(b) illustrate a top surface 68 showing the general configuration of electrodes 26 on a single layer of a touch sensor 50, according to a specific embodiment of the invention. The top surface 68 may be a top surface of the substrate 12. In the specific example of FIG. 2(b), for description purposes there are four areas 70-76 but different embodiments may have fewer or more than four areas (such as seen in the example of FIG. 2(a), where there are many more than four areas and a touch (shown by a circle) is made on multiple horizontal sensing electrodes and on more than one area. For simplicity, the description will be provided in connection with FIG. 2(b). As seen in FIG. 2(b), which could be an expanded partial view compared to FIG. 2(a), the touch sensor 50 may be divided into a plurality of areas 70-76 that each includes at least one horizontal sensing electrode and a plurality of vertical sensing electrodes. In general, signal levels associated with the horizontal sensing electrodes are used to identify the horizontal location of a touch on the touch sensor 50. The signal levels associated with the vertical sensing electrodes are used to identify the vertical location of the touch in conjunction with the horizontal location that is determined based on measurements of the horizontal sensing electrode(s). In one embodiment, each of the areas 70, 72, 74, and 76 includes one horizontal sensing electrode 52, 54, 56 and 58, respectively, wherein each of the horizontal sensing electrodes 52-58 is connected to a different electronic channel as discussed below. In other embodiments, more than one horizontal sensing electrode 5258 may be connected to a single electronic channel. Rectangular blocks 60, 62, 64 and 66 generally indicate areas that include a plurality of vertical sensing electrodes wherein the vertical sensing electrodes in one block 60 are connected to the vertical sensing electrodes that are located within the same general position in the other area blocks 6266. Electrode patterns within the different blocks 60-66 may be the same electrode pattern or a combination of different electrode patterns. Although a plurality of different electrode patterns are discussed herein, it should be understood that other electrode patterns are also contemplated. The numbers of electronic channels used to sense the vertical sensing electrodes may be based on the number of vertical sensing electrodes, precision desired, electrode pattern, and the like. It is noted that in FIG. 2(a), the areas (70, 72, 74, 76 . . . ) are not labeled, but instead horizontal sensing electrodes (52, 54, 56, 58 . . . ) and blocks (60, 62, 64, 66 . . . ) are generally shown.

Figure 3:
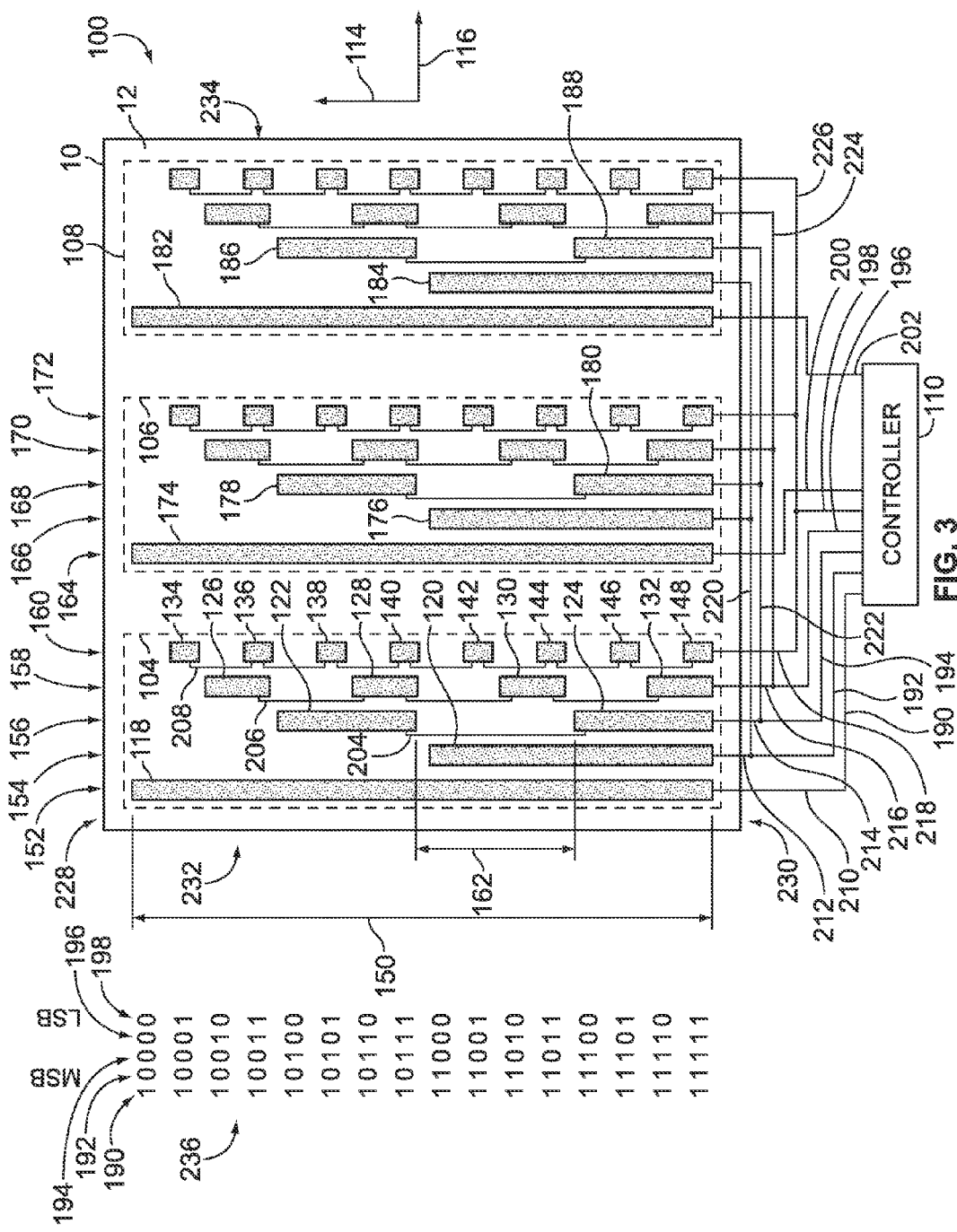
FIG. 3 illustrates a touch sensor formed in accordance with an embodiment of the present invention that is connected to a controller.

FIG. 3 illustrates a projected capacitive touch sensor 10 that may be used within a touch sensor system 100, according to a specific embodiment. The touch sensor 10 has sets of electrodes coupled to corresponding areas on a surface of the substrate 12, wherein each set of electrodes includes a horizontal sensing electrode and a plurality of vertical sensing electrodes. For illustration and discussion purposes, first, second and third areas 104, 106 and 108 are shown. The areas 104-108 are non-overlapping and located within the same plane. Although not shown, the areas 104-108 may be immediately adjacent, similar to FIGS. 2(a) and 2(b), wherein all of the touch surface area of the substrate 12 is covered by an area. It should be understood that the touch sensor 10 may have more than the three areas shown in FIG. 3. Although the areas 104-108 are shown as rectangular and extending along the entirety of one dimension of the usable touch area of the touch sensor 10, it should be understood that the areas 104-108 may be other shapes and dimensions.

The substrate 12 may be glass, a polymer film such as polyethylene terephthalate (PET), a metal such as aluminum, or other suitable material. The electrodes are formed on the substrate 12. Some of the electrodes may be substantially square in shape while some electrodes may be rectangular. It should be understood that other shapes may be used. There is no overlap of individual electrodes and all of the electrodes may be formed on a single plane or surface, such as the top surface, of the substrate 12. In the embodiment shown, the sets of electrodes form the same electrode pattern within each of the areas 104-108. In other embodiments the sets of electrodes may not form the same electrode pattern within each of the areas 104-108 and may form the same electrode pattern within a subset of the areas 104-108.

The electrodes may be fabricated as a conductive film covering the entirety of the electrode area, a conductive film that incompletely fills the area such as with a mesh pattern, a serpentine pattern or other pattern. For example, an electrode may be formed of more than one area of conductive film located close together and electrically connected to each other. Each of the electrodes may be formed of a continuous loop of a conductive material, such as by forming a serpentine pattern using fine metal wires to fill in an outline of each electrode. The wires may be, for example, between ten and twenty-five micrometers thick. In another embodiment, the electrodes may be formed from a deposited conductive coating that may be deposited in a desired pattern, such as by using screen printing, photographic, or other process. The conductive coating may be indium tin oxide (ITO), antimony tin oxide (ATO), a fluorine-doped tin oxide, a carbon-nanotube containing film, a silver nano-wire containing film, an intrinsically conductive polymer, and the like.

The touch sensor 10 has a Y or vertical axis 114 and an X or horizontal axis 116. Designators top 228, bottom 230, left 232 and right 234 are given with respect to the touch sensor 10 for reference only. Referring to the first area 104, the set of electrodes includes horizontal sensing electrode 118 and vertical sensing electrodes 120-148. Horizontal sensing electrode 118 extends along a height 150 of a column 152 within the first area 104. In some embodiments, the height 150 of the column 152 corresponds to the height of the first area 104 along the vertical axis 114 and may also correspond to the height of the usable touch area of the touch sensor 10. Vertical sensing electrode 120 extends partially along the height 150 of another column 154. Vertical sensing electrodes 122 and 124 extend partially along the height 150 of column 156 and are physically separate with respect to each other. Gap 162 separates the vertical sensing electrodes 122 and 124. Vertical sensing electrodes 126, 128, 130 and 132 extend partially along the height 150 of column 158 and are physically separate with respect to each other. Vertical sensing electrodes 134, 136, 138, 140, 142, 144, 146 and 148 extend partially along the height 150 of the column 160 and are physically separate with respect to each other. Electrodes that are physically separate with respect to each other, such as being separated by a gap and/or another electrode, may be electrically connected together via, for example, a trace. Additionally, the electrodes are not limited to the illustrated column arrangement. For example, column 152 may be located at any column location within the first area 104. Similarly, columns 154-160 may be located in any order. The order of the columns in any other electrode pattern discussed herein may be similarly arranged in any order. Also, more columns of horizontal sensing electrodes and more or less columns of vertical sensing electrodes may be used.

According to a specific embodiment, the set of electrodes in the second area 106 forms the same pattern as within the first area 104. The electrodes are formed in columns 164-172 in area 106. Horizontal sensing electrode 174 extends along column 164 while vertical sensing electrodes extend partially along columns 166, 168, 170 and 172. Vertical sensing electrodes in the first area 104 correspond to vertical sensing electrodes of the second and third areas 106 and 108 that are located in the same relative column and in substantially the same position along the vertical axis 114. For example, vertical sensing electrode 120 in area 104 corresponds to vertical sensing electrode 176 in area 106; vertical sensing electrodes 122 and 124 in area 104 correspond to vertical sensing electrodes 178 and 180 in area 106, respectively; and so on. Not all of the electrodes are given separate item numbers. In one embodiment, electrodes in one area may correspond to electrodes in another area that are not located in the same relative position.

For clarity, the electrode pattern shown in FIG. 3 may not be to scale. For example, the areas 104-108 may be positioned closer together with less open space between them. In one embodiment, each column 152-160 and 164-172 may be spaced equidistant from neighboring columns, regardless of which area the column is in. For example, columns 158 and 160 may be separated by the same distance as columns 160 and 164. Additionally, the dimensions of the electrodes may be different than illustrated. In one embodiment, the first area 104 may be five millimeters (mm) in width along the horizontal axis 116. In another embodiment, a left side of the horizontal sensing electrode 118 may be spaced five mm from a left side of the horizontal sensing electrode 174. Also, the height of the vertical sensing electrode 134 along the vertical axis 114 may be five mm. It should be understood that other dimensions may be used.

The controller 110 provides a predetermined number of capacitance measuring electronic channels, such as twelve electronic channels. One or more electrodes may be attached to each of the electronic channels. In one embodiment, horizontal sensing electrode 118 is the only electrode connected to electronic channel 190, horizontal sensing electrode 174 is the only electrode connected to electronic channel 200, and horizontal sensing electrode 182 from within the third area 108 is the only electrode connected to electronic channel 202. In one embodiment, vertical sensing electrodes in one area are electrically connected to corresponding vertical sensing electrodes within different areas or sets of electrodes, and to the same electronic channel. For example, vertical sensing electrodes 120, 176 and 184 are electrically connected together and to electronic channel 192. Vertical sensing electrodes 122, 124, 178, 180, 186 and 188 are also electrically connected together and to electronic channel 194. Similarly, vertical sensing electrodes 126-132 are electrically connected to corresponding electrodes within the second and third areas 106 and 108 and to electronic channel 196. Vertical sensing electrodes 134-148 are electrically connected to corresponding electrodes within the second and third areas 106 and 108 and to electronic channel 198.

In one embodiment, traces 204, 206, 208, 210, 212, 214, 216, 218, 220, 222, 224 and 226 (not all traces are indicated with item numbers) may be formed from materials such as the conductive wire, silver-frit, deposited metal films, conductive-ink, incomplete deletion-line separation of the conductive coating, and the like, to electrically connect electrodes on the substrate 12. The traces 204-226 may also convey signals and power between individual or multiple electrodes and a cable or cable connector (as shown in FIG. 1). In some embodiments the corresponding electrodes may be electrically connected to each other on the substrate 12, while in other embodiments the corresponding electrodes may be electrically connected to each other within the flexible cable or controller 110 or any combination thereof.

As shown, the configuration of FIG. 3 would utilize seven electronic channels 190-202, reducing the required number of electronic channels compared to a system that connects each electrode to a separate electronic channel or that assigns electrodes within same areas to a set number of channels. In addition, effects of electronic noise may be reduced because the scan speed may be increased, providing more individual measurements for noise suppression via signal averaging within a given period of time for each electronic channel. It should be understood that different numbers of electronic channels may be used to include more electrodes (not shown), accommodate more areas, and/or provide for a larger-sized touch sensor 10, according to other specific embodiments.

The electronic channels may be provided within an integrated circuit that may be provided on a separate chip (not shown) within controller 110. Additional chips may be included within the controller 110 to provide additional electronic channels.

The electrodes couple capacitively to finger (or to other sufficiently conductive object) contact that overlaps at least a portion of the electrode, and the controller 110 detects signal levels associated with a touch on the substrate 12 or other touch surface (e.g., touch surface 20 of FIG. 1). For example, a touch increases the level of capacitance associated with the electrodes that are under the touch area. The amount of signal that is generated depends on at least the overall size of the touch and a thickness (and dielectric constant) of the touch surface used. A thicker touch surface may result in a larger sensed touch area due to lateral spreading of electric field lines going from the finger (or other object) to the electrodes 118-148 and 174-188.

Figure 4:
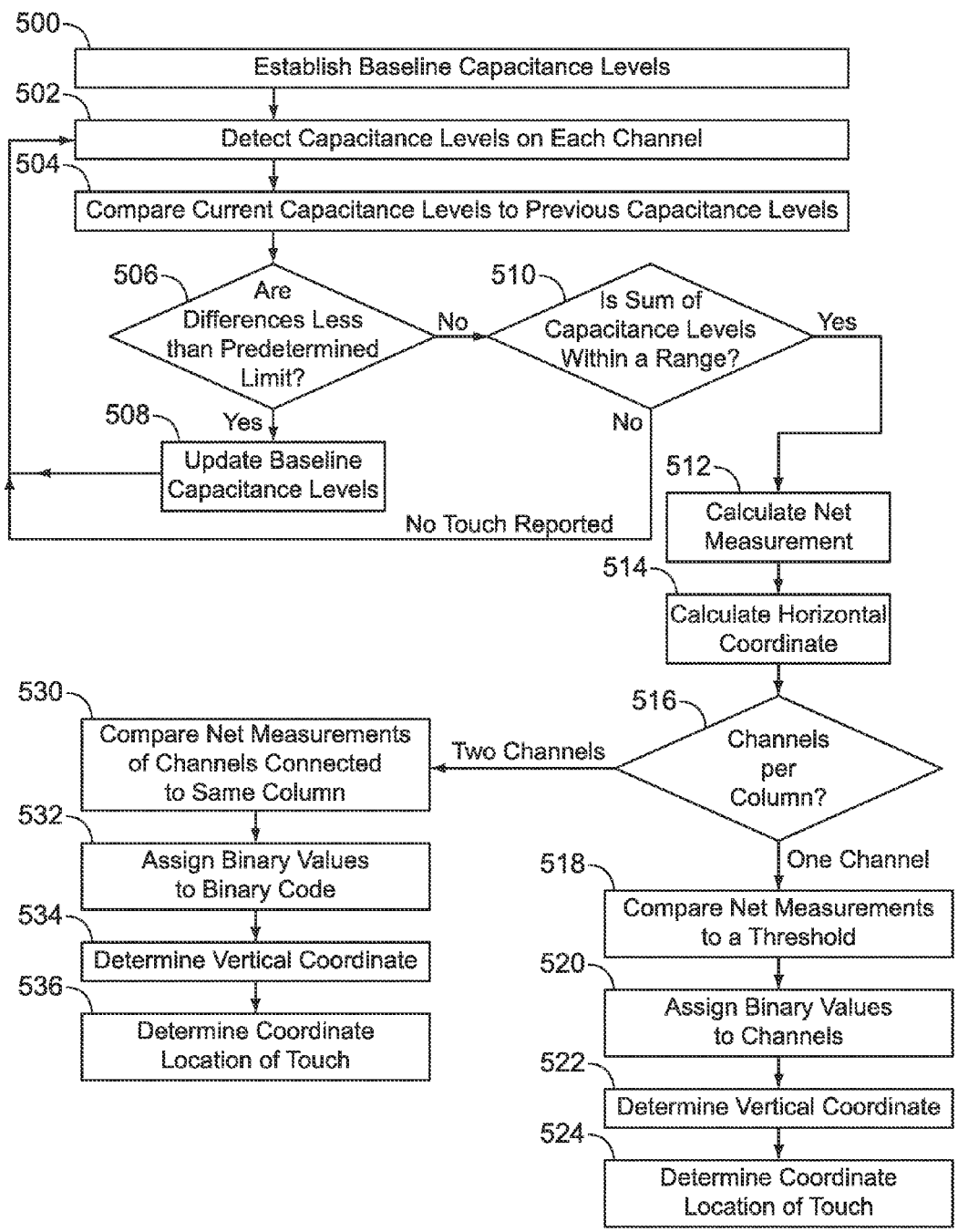
FIG. 4 illustrates a method for determining locations of touches on the touch sensor in accordance with an embodiment of the present invention.

FIG. 4 is a flow chart illustrating a method for determining coordinate locations of a touch on the touch sensor 10, according to a specific embodiment. At 500 the controller 110 establishes a baseline capacitance level for each electronic channel. This may be accomplished when the system 100 is initially powered on and no touch is present on the touch sensor 10. There may be predetermined limits within which the baseline capacitance levels are considered to be valid. In some embodiments, other adjustments may be accomplished, such as to correct for effects such as the finite resistance of ITO.

Referring also to FIG. 3, at 502 the controller 110 detects capacitance levels on each electronic channel 190-202. In one embodiment, the capacitance level may be a signal amplitude. At 504, the controller 110 compares the current capacitance levels to previously detected capacitance levels for the same channel. For example, the capacitance level detected on electronic channel 190 would be compared to the previously detected capacitance level on electronic channel 190, which may initially be the baseline. At 506 the controller 110 determines whether the differences are less than a predetermined limit. If yes, at 508 the controller 110 updates the baseline capacitance levels based on the most current detected capacitance levels. In one embodiment, the baseline may be changed to be equal to the most current detected capacitance levels, while in another embodiment, the baseline may be changed, such as with a recursive filter, based on the difference. The method returns from 508 to 502 to generate a dynamic baseline that may change over time.

Returning to 506, if the controller 110 determines that at least a portion of the electronic channels 190-202 exceed the predetermined limit, the method passes to 510. At 510 the controller 110 determines whether the sum of all the capacitance levels detected at 502 is within a range. The sum may also be referred to at the Z coordinate. The range may have a lower or first threshold and a higher or second threshold. The first threshold is determined at a level that verifies that there is a significant enough increase in capacitance to qualify as a valid touch. The second threshold may be used to reject unwanted "touches", such as when the palm of the hand comes in contact with the touch sensor 10. Therefore, if the sum or Z coordinate is not within the range, the method returns to 502 and the baseline is not updated. If the sum or Z coordinate is within the range, a valid touch is detected and at 512 the controller 110 calculates a net measurement for each of the electronic channels 190-202, which is the difference between the most current measured value (detected at 502) and the baseline.

Next, at 514 the controller 110 determines or calculates the horizontal coordinate. For example, capacitance signals from electronic channels 190, 200 and 202, which correspond to horizontal sensing electrodes 118, 174 and 182, respectively, would be used. In one embodiment, a weighted sum may be calculated over all of the electronic channels that detect signals from horizontal sensing electrodes. By way of example only, the following formula may be used to calculate the weighted sum of the horizontal coordinate: $X=(\Sigma Xi*Si)/(\Sigma Si)$, wherein the electrode number "i" has X coordinate $Xi$ and touch signal $Si$. In another embodiment, the controller 110 would determine which of the electronic channels 190, 200 and 202 has the largest capacitance value or signal. This measurement would be used in conjunction with the capacitance values from the two neighboring horizontal sensing electrodes to calculate a horizontal position. For example, if electronic channel 200 (corresponding to horizontal sensing electrode 174) has the greatest capacitance value and the capacitance values of the electronic channels 190 and 202 are substantially the same, the controller 110 may determine that the touch is centered on the horizontal sensing electrode 174. If the capacitance value of the electronic channel 190 is less than the electronic channel 200 but greater than electronic channel 202, then the touch may be positioned between the horizontal sensing electrodes 118 and 174 and closer to the horizontal sensing electrode 174.

The controller 110 then determines the vertical coordinate location. The electrode pattern shown in FIG. 3 illustrates an embodiment wherein a single electronic channel is connected to the vertical sensing electrode(s) in each column. As discussed further below, more than one electronic channel may be connected to different ones of the vertical sensing electrodes in each column. At 516, the controller 110 can be configured to determine how many electronic channels are connected per column according to a specific embodiment (alternatively, for other embodiments, the controller 110 already knows how many electronic channels are connected per column). If there is one electronic channel per column, then the method proceeds at step 518, or if there are two electronic channels per column, then the method proceeds at step 530.

At 518 the controller 110 compares the net measurements of the electronic channels connected to the vertical sensing electrodes to a threshold. At 520, if the net measurement is greater than the threshold, the controller 110 may assign a binary "1" to the channel. If the net measurement is less than the threshold, the controller 110 may assign a binary "0" to the channel. At 522, the controller 110 determines the vertical coordinate location based on a "binary code" assigned at 520.

For example, the "binary code" 236 is shown to the left side of the touch sensor 10 in FIG. 3 and will be discussed with respect to the first area 104. The electronic channel 190-198 corresponding to the column within the binary code 236 is indicated above the binary code 236. If a binary code of 10000 is generated, the left-most "1" indicates that a horizontal sensing electrode has exceeded a threshold. In the example shown, the left-most "1" corresponds to the electronic channel 190 that detects signal from column 152 and electrode 118 of area 104. The binary codes and/or binary values associated with electronic channels 200 and 202 and thus horizontal sensing electrodes 174 and 182, respectively, are not shown. The four zeros "0000" correspond to the four columns of vertical sensing electrodes 120-148 that did not generate a signal above a threshold. In FIG. 3, the corresponding columns of vertical sensing electrodes in each of the areas 104, 106 and 108 are tied together, and thus no vertical sensing electrode on the touch sensor 10 generated a signal above a threshold. For example, if electronic channel 192 is assigned a binary value of "0", then the touch is located in the top half of the touch sensor 10. If electronic channel 194 is assigned a binary value of "0", then the touch is located in either the top quarter or lower-middle quarter of the touch sensor 10. The binary code assigned to electronic channel 196 identifies which set of vertical eighths of the touch sensor 10 the touch is located within, and the binary code assigned to electronic channel 198 identifies which set of vertical sixteenths of the touch sensor 10 the touch is located within. That is, channels 196 and 198 determine whether the touch is on the areas with electrodes or on the blank areas without the electrodes, and the vertical position can be determined by combining all vertical channel information.

In the example wherein the binary code is "10000", the "1" identifies the horizontal location on the touch sensor 10 and the vertical location is within the top sixteenth of the touch sensor 10. Therefore, returning to FIG. 4, at 524 the controller 110 determines the coordinate location of the touch based on the binary code 236.

A touch just slightly lower on the touch sensor 10 that covers at least a part of vertical sensing electrode 134 may generate a binary code of 10001. Therefore, the binary code as determined by the controller 110 is indicated in FIG. 3 as parallel or in-line with the vertical position of a touch that would generate the binary code. It should be understood that, similar to top 228, bottom 230, left 232 and right 234, descriptions of top half, bottom half, top quarter and the like that are used with respect to the touch sensor 10 are used for convenience when referring to the figures, and that the use and/or implementation of the touch sensor 10 with a system 100 is not so limited.

In the example of the electrode pattern of the first area 104, sixteen discrete binary codes may be generated based on the signal levels detected on the electronic channels 190-198. Ratios and/or interpolation, as discussed further below, may be used to accomplish a finer vertical precision.

Figure 5:
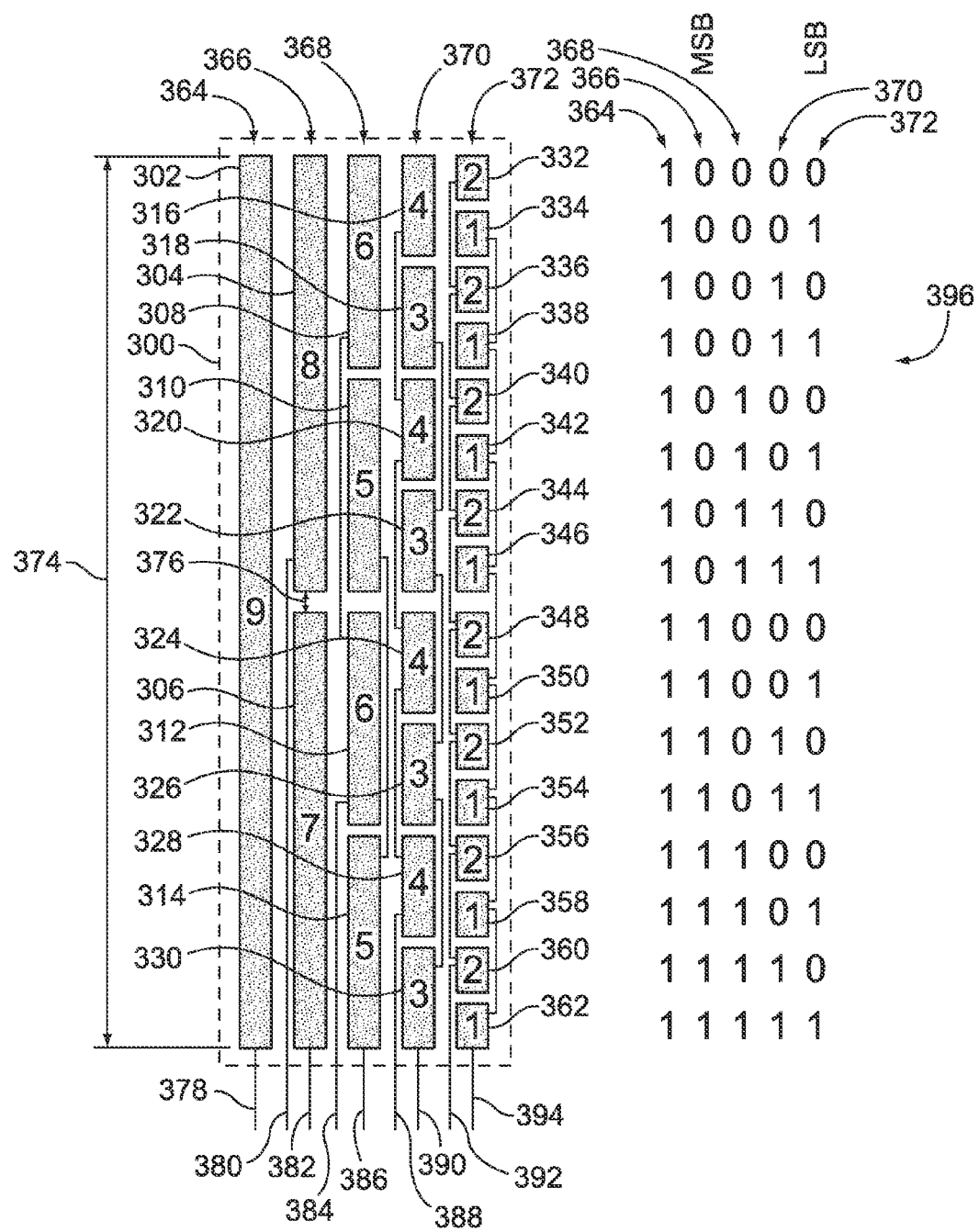
FIG. 5 illustrates an electrode pattern formed in accordance with an embodiment of the present invention.

FIG. 5 illustrates an electrode pattern that has a larger number of electrodes within area 300 compared to the electrode pattern of FIG. 3, according to a specific embodiment. Although only one area 300 is shown, a touch sensor may have many similar areas with the electrode pattern repeated across the touch sensor. As discussed with respect to FIGS. 3 and 4, signals from horizontal sensing electrodes are used to identify the horizontal location of a touch on the touch sensor and signals from vertical sensing electrodes are used to identify the vertical location of the touch on the touch sensor. Binary code 396 is also shown. In this embodiment, there are two electronic channels per column for the vertical sensing electrodes.

Horizontal sensing electrode 302 extends along a height 374 of column 364. Vertical sensing electrodes 304 and 306 are substantially equally-sized and extend partially along the height 374 of column 366 and are physically separate with respect to each other. Gap 376 separates the vertical sensing electrodes 304 and 306. Vertical sensing electrodes 308-314 are substantially equally-sized and extend partially along the height 374 of column 368 and are physically separate with respect to each other, separated by gaps (not indicated with item numbers). Vertical sensing electrodes 316-330 are substantially equally-sized and extend partially along the height 374 of column 370 and are physically separate with respect to each other, and vertical sensing electrodes 332-362 are substantially equally-sized and extend partially along the height 374 of column 372 and are physically separate with respect to each other. It should be understood that in other embodiments more or less than four columns 366-372 may be included in each area, and that different areas may have different numbers of columns of vertical sensing electrodes.

The horizontal sensing electrode 302 is electrically connected to electronic channel 378 of the controller 110 (as shown in FIG. 3). The vertical sensing electrodes 304 and 306 are connected to electronic channels 380 and 382, respectively. Vertical sensing electrodes 308 and 312 are connected to electronic channel 384, while vertical sensing electrodes 310 and 314 are connected to electronic channel 386. Vertical sensing electrodes 316, 320, 324, and 328 are connected to electronic channel 388. Vertical sensing electrodes 318, 322, 326 and 330 are connected to electronic channel 390. Vertical sensing electrodes 332, 336, 340, 344, 348, 352, 356 and 360 are connected to electronic channel 392. Vertical sensing electrodes 334, 338, 342, 346, 350, 354, 358 and 362 are connected to electronic channel 394. Therefore, the connections to the two electronic channels within a column alternate between adjacent vertical sensing electrodes.

As discussed with respect to FIG. 3, the horizontal sensing electrode 302 may be the only electrode connected to the electronic channel 378. Other horizontal sensing electrodes on the touch sensor may each be connected to their own electronic channels. The vertical sensing electrodes 304-362 may be electrically connected to corresponding electrodes within other areas (not shown) to minimize the number of electronic channels needed. In the example of FIG. 5, nine electronic channels 378-394 are shown, and each additional area would result in an additional electronic channel that is connected to the horizontal sensing electrode.

Returning to FIG. 4, at 516 the controller 110 would be configured to determine or otherwise know for the embodiment shown in FIG. 5 that the vertical sensing electrodes in at least one of the columns 366-372 are connected to two electronic channels, and the method proceeds from 516 to 530. In one embodiment, if the vertical sensing electrodes in one or more of the columns 366-372 were connected to a single electronic channel, such as discussed with respect to FIG. 3, then 518-524 may be used for the applicable channels.

At 530 the controller 110 compares the net measurements of the two channels that detect signals from vertical sensing electrodes located within the same column to each other. For the vertical sensing electrodes, the most significant bit (MSB) is determined by the measurement of vertical sensing electrodes 304 and 306, and the least significant bit (LSB) is determined by the measurements of the vertical sensing electrodes 332, 334, 336, 338, 340, 342, 344, 346, 348, 350, 352, 354, 356, 358, 360 and 362. The binary code 396 determined by the vertical sensing electrodes (in this example, the four digit code from MSB to LSB) at 532 is used by controller 110 at 534 to determine where the touch is located vertically on the touch sensor; whereas the horizontal sensing electrodes are used to determine where the touch is located horizontally on the touch sensor (e.g., horizontal sensing electrode 302 is assigned a binary value of "1" at step 514 if a signal is detected indicating a touch for the associated horizontal coordinate).

Therefore, if a touch is located in the top half of the touch sensor, the net measurement of the electronic channel 380 is greater than the net measurement of the electronic channel 382. If the touch is located in the bottom half of the touch sensor, the net measurement of the electronic channel 382 is greater than the net measurement of the electronic channel 380. When the net measurement of the electronic channel 380 is greater, indicating a touch located in the top half of the touch sensor, the binary value in the column 366 of the binary code 396 associated with electronic channels 380 and 382 is assigned a "0", and if the touch is located in the bottom half of the touch sensor, wherein the net measurement of the electronic channel 382 is greater, the binary value is a "1".

Similarly, if the electronic channel 384, which is connected to both the uppermost vertical sensing electrode 308 and the middle-lower vertical sensing electrode 312 in column 368, detects the touch (and thus has a greater net measurement than electronic channel 386), then the binary value in column 368 within the binary code 396 is assigned a "0". If the electronic channel 386 connected to both the middle-upper vertical sensing electrode 310 and the lowermost vertical sensing electrode 314 detects the touch (e.g., net measurement of the electronic channel 386 is greater than net measurement of electronic channel 384), then the binary value in column 368 is assigned a "1".

The next column (column 370) to the right in the binary code 396 is determined by the net measurements on the two electronic channels 388 and 390, which determine which set of vertical eighths of the touch sensor the touch is located within. In the example shown, a binary value of "0" is assigned to column 370 if the binary code 396 when the electronic channel 388 has the highest net measurement, and a binary value of "1" is assigned when the electronic channel 390 has the highest net measurement.

The right-most column 372 in the binary code 396, which is the LSB, is determined by the net measurements on the two electronic channels 392 and 394 which determine which set of vertical sixteenths of the touch sensor the touch is located within. In this example, a binary value of "0" is assigned when the electronic channel 392 has the highest net measurement, and a binary value of "1" is assigned when the electronic channel 394 has the highest net measurement.

Returning to FIG. 4, at 534 the controller 110 determines the vertical coordinate location of the touch based on the binary code. At 536 the controller 110 determines the coordinate location of the touch based on the previously determined horizontal and vertical coordinate locations. Accordingly, a discrete location of the touch may be quickly identified based on the binary code 396. It should be understood that the horizontal and vertical coordinate locations may be determined in any order or may be determined concurrently.

Further comparisons, ratios and/or interpolation may be used to further refine the vertical coordinate location. For example, finer resolution may be achieved beyond the sixteen discrete vertical positions by calculating a ratio between electronic channel net measurements (as discussed further below) in addition to performing the comparisons as discussed above. For example, ratios of the signals from the vertical sensing electrodes can be used to interpolate a more precise vertical position between two discrete vertical positions.

In addition, the size of the touch may be determined. A minimum size may be predetermined, such as five mm, wherein a touch that is determined to be less than five mm in size is rejected. This may be determined, for example, by requiring five columns of electrodes that are adjacent to each other on the touch sensor to generate capacitance levels indicative of a touch. Other minimum and/or maximum sizes may be used. When a ratio is determined to fine tune the resolution, the size of the touch may be taken into consideration. For example, a ratio correction curve may be selected based on the size of the touch. A plurality of ratio correction curves may be used.

Additionally, any number of filters, processing, offset correction, and the like may be applied. For example, a touch may only be validated if the touch is reported for a minimum of three consecutive scans.

In other embodiments, smaller electrodes and/or more columns of electrodes may be included within the area 300 to provide increased precision. Furthermore, the vertical resolution may be doubled or otherwise increased by adding only one or several channels.

Figure 6A:
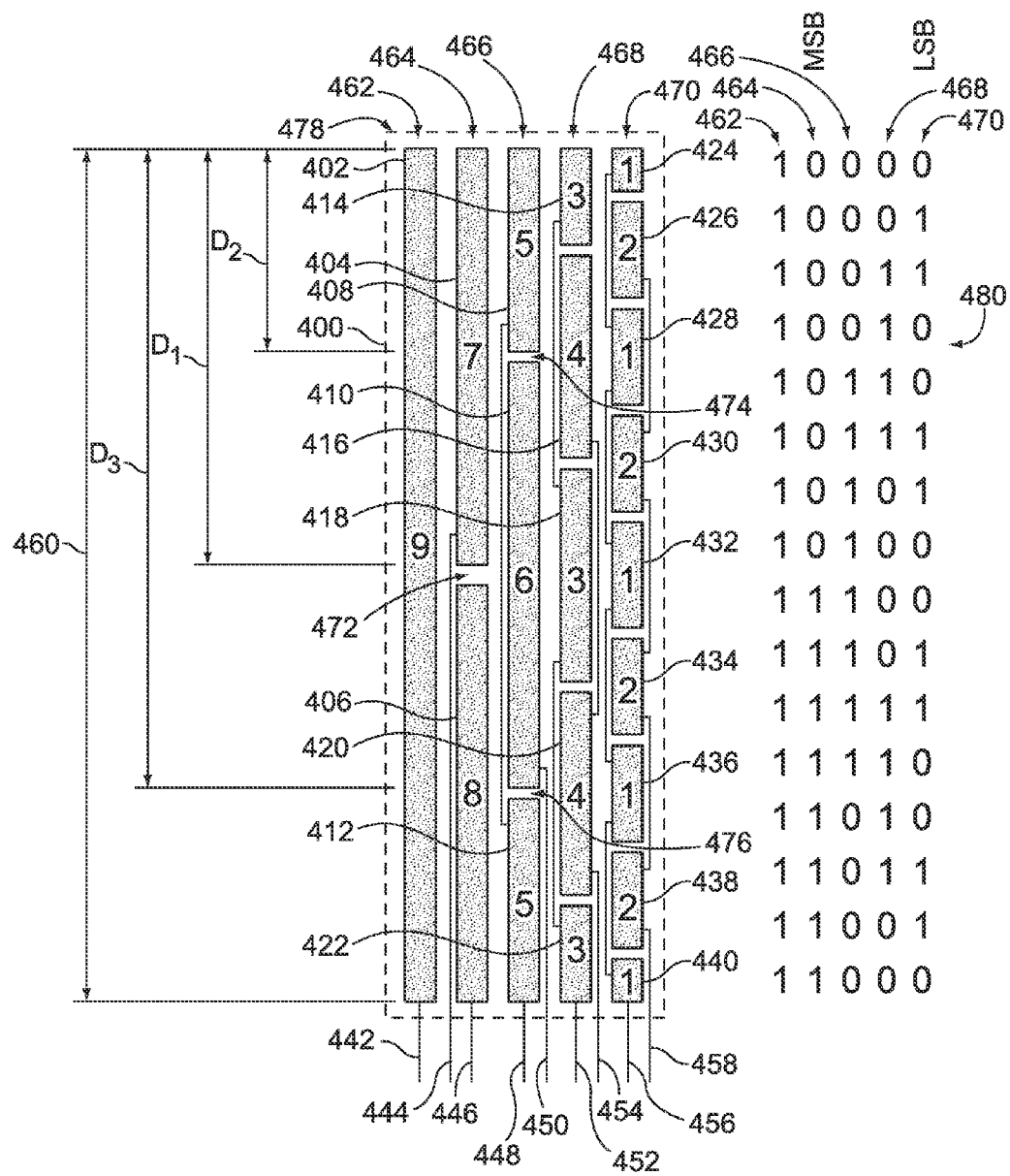
FIG. 6(a) illustrates an electrode pattern having offset electrodes that are formed in accordance with an embodiment of the present invention.

FIG. 6(a) illustrates an electrode pattern that utilizes the same number of electronic channels as the electrode pattern in FIG. 5, according to another specific embodiment. However, the dimensions, positions and quantity of the electrodes are different. Although only one area 400 is shown, a touch sensor may have many areas with the illustrated pattern repeated across the touch sensor. Again, signals from horizontal sensing electrode 402 and other horizontal sensing electrodes (not shown) are used to identify the horizontal location of a touch on the touch sensor. Signals from vertical sensing electrodes 404-440 and other vertical sensing electrodes (not shown) are used to identify the vertical location of the touch on the touch sensor.

The horizontal sensing electrode 402 extends along a height 460 of column 462. Vertical sensing electrodes 404 and 406 extend partially along the height 460 of column 464 and are physically separate with respect to each other. Gap 472 separates the vertical sensing electrodes 404 and 406. Vertical sensing electrodes 408-412 extend partially along the height 460 of column 466 and are physically separate with respect to each other, separated by gaps 474 and 476. Vertical sensing electrodes 414-422 extend partially along the height 460 of column 468 and are physically separate with respect to each other, separated by gaps (not indicated by item numbers). Vertical sensing electrodes 424-440 extend partially along the height 460 of column 470 and are physically separate with respect to each other, also separated by gaps. As discussed previously, the columns 462-470 may be arranged in any order within the area 400.

Figure 6B:
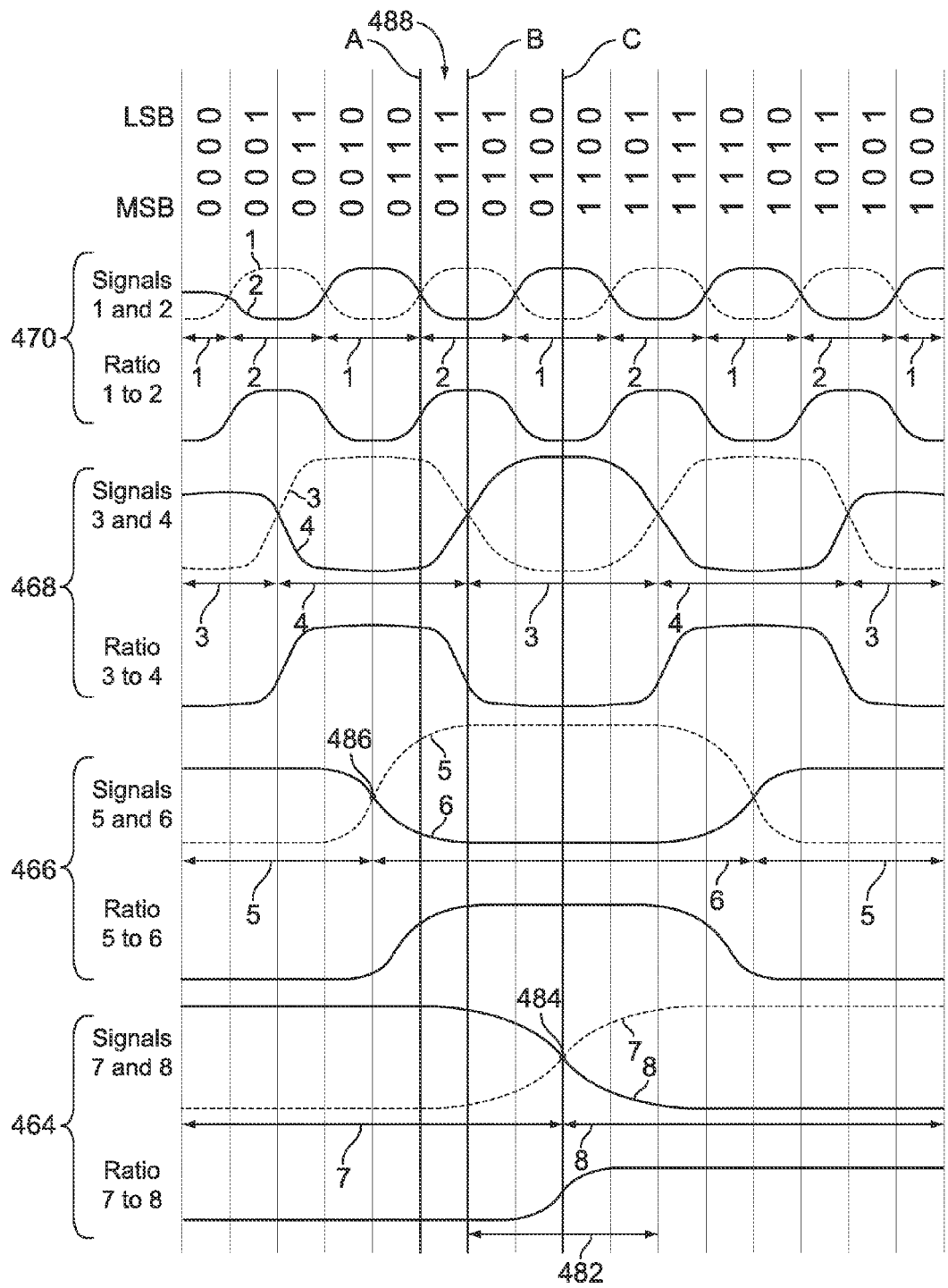
FIG. 6(b) illustrates signals on all vertical electrodes of an area as a function of a vertical coordinate of a touch determined in accordance with an embodiment of the present invention.

The gaps 472, 474 and 476, as well as the other gaps not indicated with item numbers, are located distances from top 478 of the area 400 that are different with respect to each other. As seen in FIG. 6(*a*), there are fifteen gaps vertically separating the various vertical sensing electrodes from each other, and these gaps are different distances from the top 478. For example, gaps 472, 474 and 476 are located distances D1, D2 and D3, respectively, from the top 478. With respect to the gap 472, vertical sensing electrodes 410, 418 and 432 in the other columns 466, 468 and 470, respectively, extend through the distance D1. By offsetting the gaps 472-476, as well as the other gaps within the electrode pattern, the binary code of one discrete vertical position and that of either neighboring vertical positions differs by only one bit. Since only one bit changes state from one position to the next, certain data errors that could occur during state changes are prevented, and thus the data is more reliable. For example, in FIG. 5, if the touch is located slightly above the middle of the area 300 and moves downward slightly, the binary code will change from 10111 to 11000. In this case, all four vertical bits must change simultaneously in order to avoid the reporting of an erroneous vertical location. In FIG. 6(*a*), however, only one electronic channel will change state, or binary value, at a time as a finger is moved downward through the area 400.

As with the electrode pattern of FIG. 5, the horizontal sensing electrode 402 is electrically connected to electronic channel 442 of the controller 110 (as shown in FIG. 2). The vertical sensing electrodes 404 and 406 are connected to electronic channels 444 and 446, respectively. Vertical sensing electrodes 408 and 412 are connected to electronic channel 448, while vertical sensing electrode 410 is connected to electronic channel 450. Therefore, each column may not have an equal number of electrodes connected to each of the channels. Vertical sensing electrodes 414, 418 and 422 are connected to electronic channel 452, alternating with the vertical sensing electrodes 416 and 420 that are connected to electronic channel 454. Vertical sensing electrodes 424, 428, 432, 436 and 440 are connected to electronic channel 456, alternating with the vertical sensing electrodes 426, 430, 434 and 438 that are connected to electronic channel 458.

Again, the horizontal sensing electrode 402 may be the only electrode connected to the electronic channel 442. The vertical sensing electrodes 404-440 may be electrically connected to corresponding electrodes within other areas (not shown) to minimize the number of electronic channels needed.

An exemplary binary code 480 is illustrated next to the area 400. If electronic channel 444, associated with vertical sensing electrode 404, has a greater signal than electronic channel 446, which is associated with the vertical sensing electrode 406, then the touch is in the upper half of the area 400 and a binary value of "0" may be assigned to the corresponding column of the binary code 480. If the electronic channel 446 has a greater signal than electronic channel 444, then the touch is in the lower half of the area 400 and a binary value of "1" may be assigned. The discrete vertical location of the touch may be quickly identified based on the binary code 480, ratios and/or comparisons between the adjacent electrodes in a same column (such as adjacent electrodes 404 and 406 in column 464), comparisons between electrodes of adjacent columns, interpolation and/or further processing. In other embodiments, smaller electrodes, additional electronic channels, and/or more columns of electrodes may be included within the area 400 to provide increased precision.

For example, finer resolution may be achieved beyond the sixteen discrete vertical positions as indicated by the binary code 480 by calculating ratios between certain channel net measurements in addition to performing the comparisons as discussed with respect to FIG. 4. For example, referring to the electrode pattern of FIG. 6(*a*), a ratio between two signals within one column may be used together with a ratio between two signals within another column.

FIG. 6(*b*) illustrates signals of all eight vertical sensing electrodes as well as ratios between the two signals in each of the four columns (464, 466, 468 and 470) as a function of a touch moving along the Y axis, such as from the top 478 of the area 400 to the bottom, according to a specific embodiment. The numbers 1-8 are used to indicate the signals associated with the vertical sensing electrodes 404-440, which are also indicated with numbers 1-8, of FIG. 6(*a*). The columns 464, 466, 468 and 470, as previously discussed with respect to FIG. 6(*a*), are illustrated on the left side of the figure. The binary code for each of the vertical positions is shown at the top of the figure. It should be noted that the horizontal bit of the binary code is excluded, and that arrow 482 indicates the vertical direction. Lines indicating vertical locations "A", "B" and "C" are also shown.

The two signals that are shown for each column 464-470 reflect that an active touch is present at each vertical location corresponding to each binary code. That is, the signals have amplitudes, or peaks and troughs. The signals reflecting active touches across one area of the touch sensor and along an entire height 460 of the area are displayed for ease of description herein, but do not reflect an application of the touch sensor. For example, the signal amplitudes of signals 1-8 as shown may be captured to reflect a finger touch being dragged from the top 478 of the area 400 to the bottom. When a touch is not present at a particular vertical/horizontal location, the amplitude of the signals would be at zero or other constant or minimally varying value.

Ratios between signals within columns can be used to interpolate a more precise vertical position within the range of the discrete vertical position. The crossing points of the signals correspond to the gaps between the electrodes in the columns. For example, crossing point 484 of the signals 7 and 8 corresponds to the gap 472, and crossing point 486 between signals 5 and 6 corresponds to the gap 474. For example, the initially determined discrete vertical position 488, which corresponds to binary code 0111, may be further refined to a vertical position within the range of the discrete vertical position, or between vertical locations "A" and "B". In other words, signal ratios that are used for interpolation are determined from the signals in the two columns that contain a gap between electrodes on either vertical side of the determined discrete vertical position. In this example, column 470 contains a gap between electrodes 1 and 2 at the top of the discrete vertical position 488, where the gap corresponds to the crossing of signals 1 and 2 at vertical location "A". Likewise, column 468 contains a gap between electrodes 3 and 4 at the bottom of discrete vertical position 488, where the gap corresponds to the crossing of signals 3 and 4 at vertical location "B". At vertical location "A", the slopes of the signals 1 and 2 of column 470 are relatively steep and therefore the ratio curve of signals 1 and 2 is also steep near this vertical location. In this example, signals 1 and 2 may be reviewed first as the electrodes in column 470, in the embodiment shown, are the smallest in size. The ratio between signals 1 and 2 at vertical location "A" may be changing enough to provide sufficient information for determining a more precise vertical position. Near vertical location "B", however, the slopes of the signals 1 and 2 are relatively flat and therefore the ratio curve of signals 1 and 2 is also flat around this vertical location. The ratio of signals 1 and 2 is not changing enough around vertical location "B" to accurately determine a more precise vertical position based solely on this ratio. The ratio between signals 3 and 4 of column 468 is changing relatively significantly at vertical location "B", however, and thus this ratio may be used in combination with the ratio of signals 1 and 2 to interpolate a more precise vertical position. For example, the two ratios may be divided to determine a magnitude that is used to calculate an interpolated vertical position between the initially determined discrete vertical location (such as may be determined using the method of FIG. 4) and the neighboring positions. For example, the initially calculated discrete vertical position 488, corresponding to binary code 0111, may be adjusted vertically based on the magnitude corresponding to the two ratios, namely, between the ratio of signals 1 and 2 and between the ratio of signals 3 and 4.

At vertical location "C", or the vertical centerline which is in between the discrete vertical positions associated with binary codes 0100 and 1100, the slopes of the signals 1, 2, 3 and 4 of columns 468 and 470 and thus the associated ratio curves are all relatively flat. Therefore there is not enough information between these two columns alone to precisely determine the vertical location near vertical location "C". The ratio between signals 7 and 8 of column 464 is, however, changing significantly at vertical location "C" and so this ratio can be used in combination with the ratio between signals 1 and 2 to calculate a more exact vertical location. In one embodiment, it may be desirable to use the ratio of the signals 1 and 2, either alone or in combination with another ratio. It should be understood that the second set of signals may be within a different area. In some embodiments, the sets of signals to use for interpolation may be predetermined based on the binary code.

Although not shown, a touch may extend across more than one area. In some embodiments, signals 1 and 2, or other sets of signals, from more than one area may be used to interpolate a touch location.

It should be understood that the use of interpolation may depend upon the desired resolution. For example, interpolation may not be used if the size of the smallest electrodes within the column associated with the LSB provides the desired vertical resolution.

Figure 7:
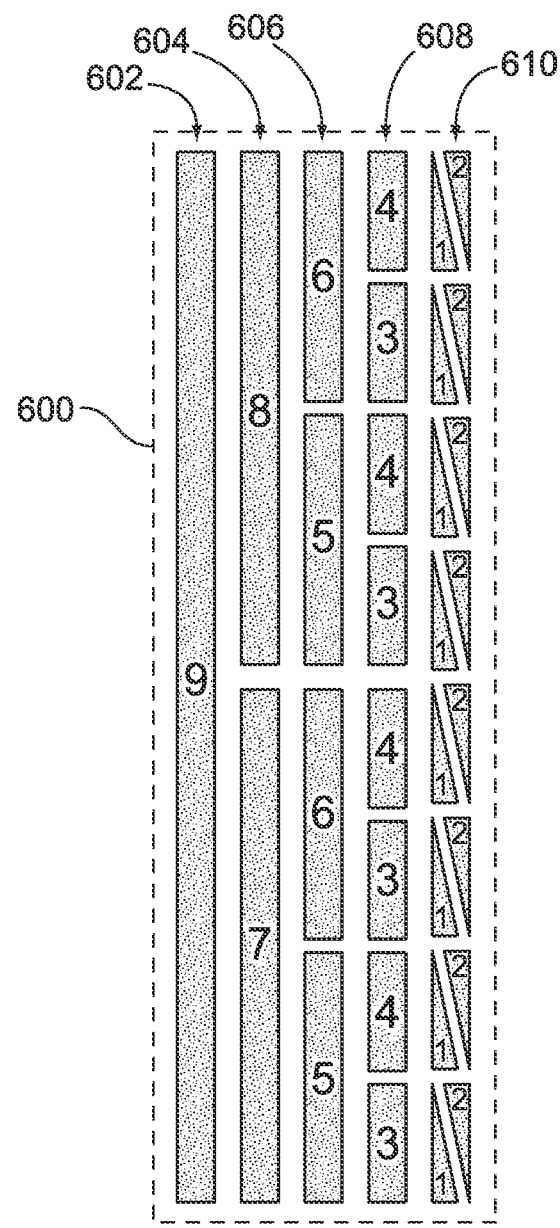
FIG. 7 illustrates another electrode pattern formed in accordance with an embodiment of the present invention.

FIG. 7 illustrates another electrode pattern, according to another specific embodiment. Area 600 includes columns 602, 604, 606, 608 and 610. The electrodes in columns 602-608 are the same configuration as illustrated in FIG. 5, and thus will not be described again. Vertical sensing electrodes in column 610, however, are triangular shaped, wherein vertical sensing electrodes indicated with a "1" are all connected to one electronic channel and vertical sensing electrodes indicated with a "2" are all connected to another electronic channel. The vertical sensing electrodes in columns 604-608 determine in which vertical eighth the touch is located. The ratio between measurements of a pair of triangular electrodes "1" and "2" in column 610 may be used to interpolate a more precise position within the discrete vertical eighth associated with that pair. That is, if the touch is vertically located so that the signal in column 608 is essentially all in one electrode (e.g., an electrode 3), then the ratio of the signals in column 610 in electrodes 1 and 2 gives a fine measurement of the vertical position of the touch within the length of the touched electrode 3 in column 608. In contrast, when the signal in column 608 is shared between two electrodes (one labeled "3" and another labeled "4"), then this ratio of the signals in column 610 is used to provide a fine measurement of the vertical position of the touch or the signals from column 610 may not be used. Accordingly, in other embodiments similar to FIG. 7, the binary electrode pattern according to various specific embodiments may be utilized with another electrode pattern (such as seen in column 610).

Figure 8:
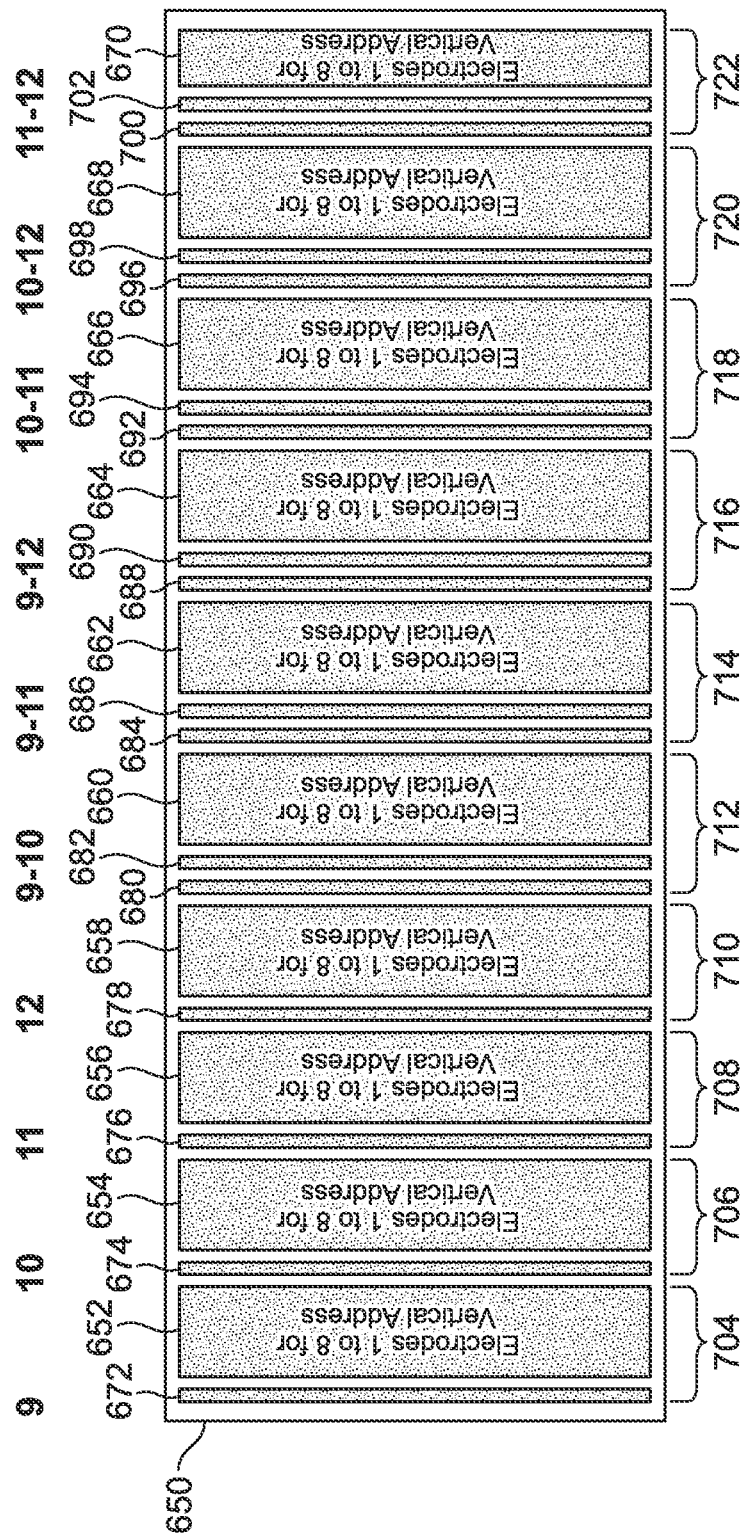
FIG. 8 illustrates a touch sensor wherein more than one horizontal sensing electrode may be connected to the same electronic channel in accordance with an embodiment of the present invention.

FIG. 8 illustrates a touch sensor 650 wherein more than one horizontal sensing electrode may be connected to the same electronic channel, according to a specific embodiment. As discussed above with respect to FIGS. 2(*a*) and 2(*b*), rectangular blocks 652, 654, 656, 658, 660, 662, 664, 666, 668 and 670 generally indicate the vertical sensing electrodes that may be arranged in one or more of the electrode patterns previously discussed, or a different electrode pattern. The vertical sensing electrodes in one block 652 may be connected to the corresponding vertical sensing electrodes in the other blocks 654-670 as previously discussed.

Possible electronic channel assignments are shown above the associated horizontal sensing electrodes of the touch sensor 650. In one embodiment, horizontal sensing electrodes 672, 674, 676 and 678 are assigned to electronic channels nine, ten, eleven and twelve, respectively. Therefore, the sets of electrodes within areas 704, 706, 708 and 710 each include one horizontal sensing electrode and a plurality of vertical sensing electrodes.

The size of the touch sensor 650 may be increased without increasing the number of electronic channels needed (or minimizing the number of additional electronic channels needed) by increasing the number of areas in the horizontal direction and by sensing more than one horizontal sensing electrode with the same electronic channel. The sets of electrodes within areas 712-722 each include two horizontal sensing electrodes and a plurality of vertical sensing electrodes. For example, horizontal sensing electrodes 680 and 682 within the area 712 are sensed by electronic channels nine and ten, respectively. Horizontal sensing electrodes 684 and 686 within the area 714 are sensed by electronic channels nine and eleven, respectively. Area 716 has two horizontal sensing electrodes 688 and 690 sensed by electronic channels nine and twelve, respectively, area 718 has horizontal sensing electrodes 692 and 694 sensed by electronic channels ten and eleven, respectively, area 720 has horizontal sensing electrodes 696 and 698 sensed by electronic channels ten and twelve, respectively, and area 722 has horizontal sensing electrodes 700 and 702 sensed by electronic channels eleven and twelve, respectively. Although areas are shown with one or two horizontal sensing electrodes, one or more areas may have more than two horizontal sensing electrodes.

The two horizontal sensing electrodes within the areas 712-722 are illustrated as adjacent with respect to each other. That is, horizontal sensing electrodes 680 and 682 are adjacent, horizontal sensing electrodes 684 and 686 are adjacent, and so on. In other embodiments, the two horizontal sensing electrodes within an area do not have to be adjacent to each other. For example, one of the horizontal sensing electrodes may be interspersed with the columns of vertical sensing electrodes, or may be positioned one on either side of the group of columns of vertical sensing electrodes.

Additionally, it should be understood that different electronic channel assignments may be used other than those indicated in FIG. 8.

Figure 9:
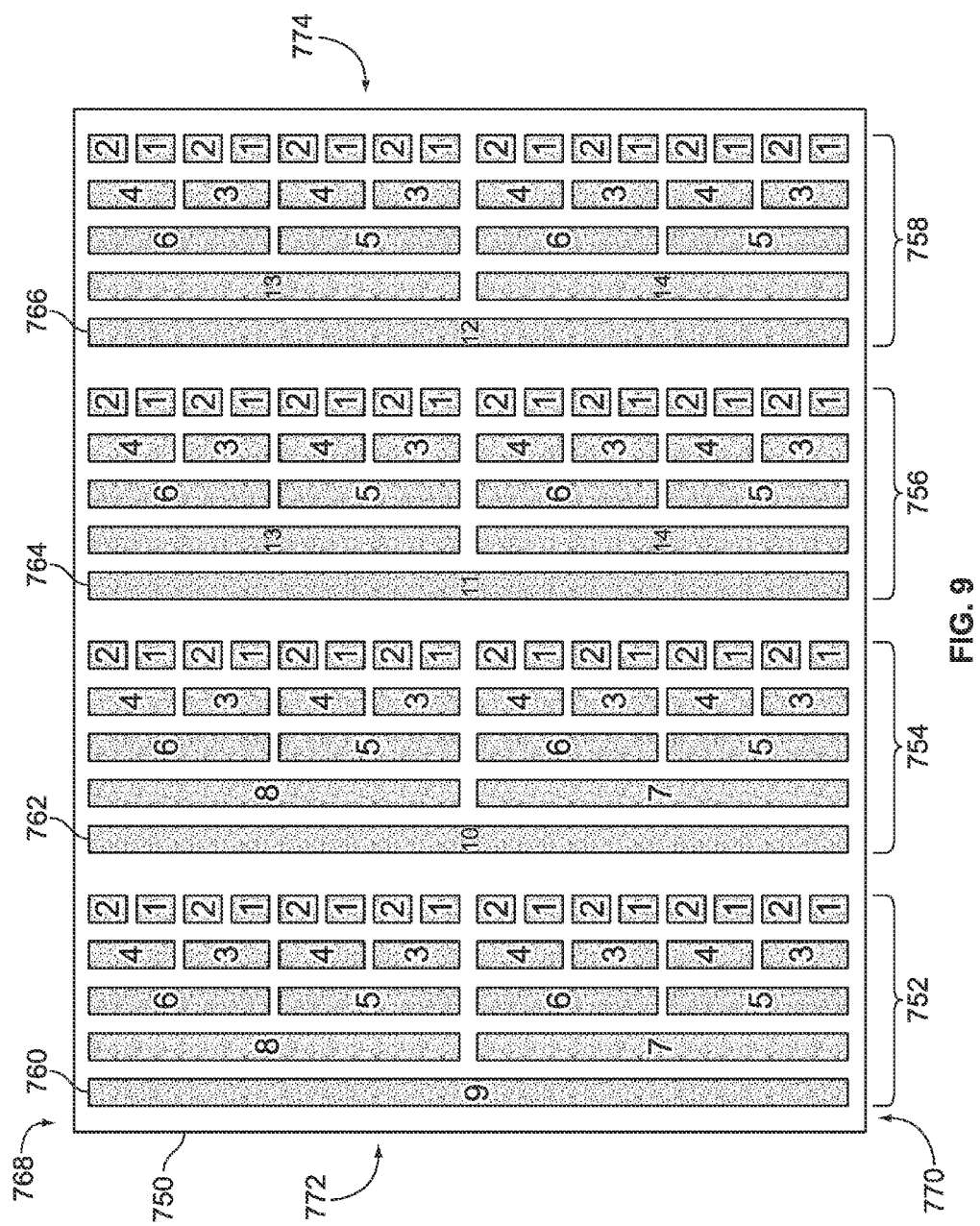
FIG. 9 illustrates a touch sensor formed in accordance with an embodiment of the present invention that may detect two simultaneous touches.

FIG. 9 illustrates a touch sensor 750 that may detect two simultaneous touches, according to a specific embodiment. The electrode pattern is similar to that discussed in FIG. 5. Four areas 752, 754, 756 and 758 each include one horizontal sensing electrode 760, 762, 764 and 766, respectively. In one embodiment, the horizontal sensing electrodes 760, 762, 764 and 766 are connected to different electronic channels nine, ten, eleven and twelve, respectively. The touch sensor 750 is discussed with respect to the designations of top 768, bottom 770, left 772 and right 774, but is not so limited.

The vertical sensing electrodes in the different areas 752, 754, 756 and 758 are connected to the same electronic channels as indicated. For example, the vertical sensing electrodes indicated with a "6" are all connected to the same channel. Vertical sensing electrodes in the top half of the left side of the touch sensor 750 are connected to electronic channel "8" and two vertical sensing electrodes in the bottom half of the left side of the touch sensor 750 are connected to the electronic channel "7". However, two corresponding vertical sensing electrodes in areas 756 and 758, in the top half of the right side of the touch sensor 750, are connected to electronic channel "13" and not to electronic channel "8". Similarly, two corresponding vertical sensing electrodes in areas 756 and 758, in the bottom half of the right side of the touch sensor 750, are connected to electronic channel "14" and not to electronic channel "7". Therefore, one touch may be detected on the left half of the touch sensor simultaneously with a second touch on the right half of the touch sensor. The horizontal coordinates of the touch on the right half of the touch sensor can be calculated by comparing signal levels associated with horizontal sensing electrodes connected to electronic channels "11" and "12". Similarly, the horizontal coordinate of the simultaneous touch on the left half of the touch sensor may be calculated by comparing signal levels associated with horizontal sensing electrodes connected to electronic channels "9" and "10". In this particular example, the vertical location of each touch can only be resolved to the upper or lower half of the touch sensor. The vertical sensing electrodes connected to electronic channels "13" and "14" are the only vertical electrodes on the right half of the touch sensor that are electrically disconnected from those on the left half of the touch sensor. Therefore, electronic channels "13" and "14" are the only vertical electrodes used to calculate the vertical position of the touch on the right half of the touch sensor. Similarly, electronic channels "7" and "8" are the only vertical electrodes used to calculate the vertical position of the touch on the left half of the touch sensor.

Although not shown, other vertical electrodes may be connected to different electronic channels to provide further vertical resolution of two simultaneous touches in other areas or for detecting more than two simultaneous touches. For example, in order to maximally resolve the vertical coordinate associated with two touches in separate areas 752-758, the vertical sensing electrodes in each area of the touch sensor may be electrically disconnected from those in other areas. In other words, vertical sensing electrodes within columns of an area may only share electronic channels within the same area, according to some embodiments.

Figure 10:
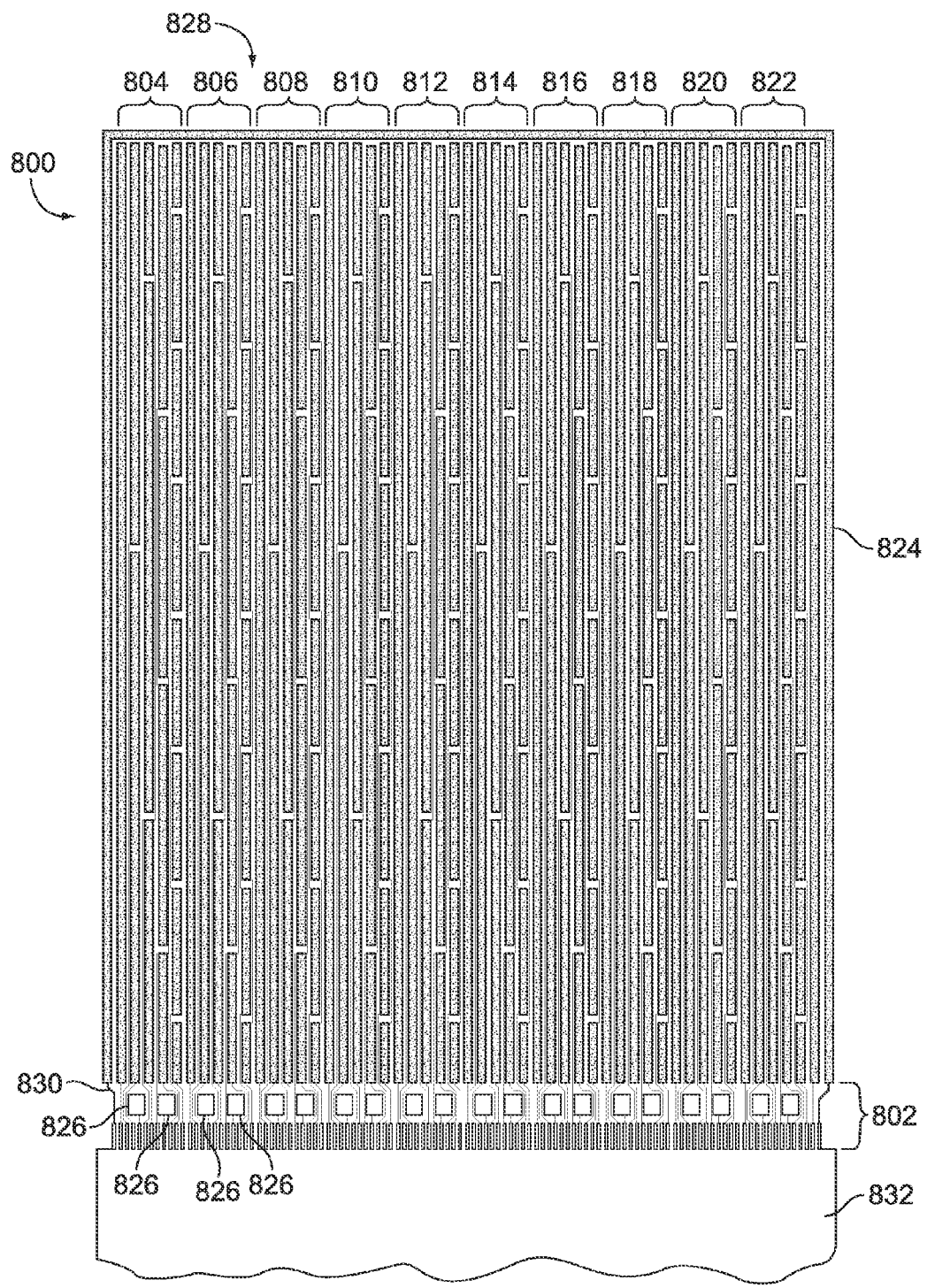
FIG. 10 illustrates a touch sensor that is connected to a flexible cable formed in accordance with an embodiment of the present invention.

FIG. 10 illustrates a touch sensor 800 that is connected at an interconnect area 802 to a flexible cable 832, according to another specific embodiment. The touch sensor 800 has areas 804, 806, 808, 810, 812, 814, 816, 818, 820 and 822 that have electrode patterns similar to the electrode pattern discussed in FIG. 6(a) wherein the gaps between electrodes are located at different distances from a top 828 of the touch sensor 800. A shield or guard electrode 824 extends around a perimeter of the touch sensor 800, but may be located on an opposite side of the substrate with respect to the electrodes as previously discussed.

The interconnect area 802 includes a plurality of interconnect touch veto electrodes 826 that are located proximate to a bottom edge 830 of the touch sensor 800. (Not all of the interconnect touch veto electrodes are indicated with item numbers.) If a touch is detected by any of the interconnect touch veto electrodes 826, then a touch may be rejected. For example, without the interconnect touch veto electrodes 826, a touch on the interconnect area 802 near the touch sensor 800 may cause an erroneous touch to be detected based on the increase in capacitance detected by some electronic channels. The interconnect touch veto electrodes 826 may be connected to the same electronic channel, or some of the interconnect touch veto electrodes 826 may be connected to a different electronic channel.

The flexible cable 832 may be two or more layers to accommodate the interconnections needed between the electrodes and the channels. Additionally, vias (not shown) may be used.

In other embodiments, hovering and/or force may be determined. For example, the controller 110 may calculate a z value, which may correspond to the area of the touch or the distance the finger is above (or away from) the touch surface 20. For example, as a finger nears the touch surface 20, the signals (such as signals 1-8) that correspond to the touch increase in magnitude. The calculated z value can be used to determine whether the finger is hovering over the sensor or making physical contact with the sensor. The touch coordinate is calculated the same way as discussed previously herein. The z value can be calculated by summing signals over only horizontal sensing electrodes or a combination of horizontal and vertical sensing electrodes. For example, a z value may be the sum of the signals of three horizontal sensing electrodes (the horizontal sensing electrode with the maximum signal of all horizontal electrodes and the two neighboring horizontal electrodes).

The force applied to the sensor during a touch can be determined by calculating a z value that is a function of this force, according to another specific embodiment. When a force is applied to the sensor, the substrate deforms and the electrodes are moved closer to the underlying ground plane, effectively increasing the magnitude of signals on all electrodes and not just those near the touch location. This z value may be the sum of all signals of horizontal electrodes.

A combination of hovering and force detection can be used to respectively excite and select icons on a display, according to another embodiment. For example, if the finger is hovering a distance, such as a half of an inch or less above the touch surface 20, such as over an icon or letter on a keyboard, the letter may be highlighted. When the controller 110 determines that a predetermined amount of force has been applied to the touch surface 20 corresponding to the same touch area, the icon or letter may be selected or activated.

It is to be understood that the above description is intended to be illustrative, and not restrictive. For example, the above-described embodiments (and/or aspects thereof)

may be used in combination with each other. In addition, many modifications may be made to adapt a particular situation or material to the teachings of the invention without departing from its scope. This written description uses examples to disclose the invention, including the best mode, and also to enable any person skilled in the art to practice the invention, including making and using any devices or systems and performing any incorporated methods. While the dimensions and types of materials described herein are intended to define the parameters of the invention, they are by no means limiting and are exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

What is claimed is:

1. A projected capacitive touch sensor, comprising:
a substrate; and
at least a first set, a second set, and a third set of electrodes coupled to a first area of the substrate, wherein:
the first set of electrodes comprises a horizontal sensing electrode that extends along a height of a first column within the first area of the substrate;
the second set of electrodes comprises at least two vertical sensing electrodes that extend partially along a height of a second column within the first area of the substrate; and
the third set of electrodes comprises at least one vertical sensing electrode more than the second set of electrodes that extend partially along a height of a third column within the first area of the substrate, the third column comprising at least two vertical sensing electrodes that are physically separate with respect to each other and electrically connected to each other;
wherein the horizontal sensing electrode in the first area of the substrate is electrically disconnected from a corresponding horizontal sensing electrode in a second area of the substrate,
wherein two of the vertical sensing electrodes in the second set of electrodes are physically separated from each other at a first distance from a top edge of the first area of the substrate, and
wherein the vertical sensing electrodes in the third set of electrodes are physically separated from each other at a set of distances from the top edge of the first area of the substrate, wherein distances in the set of distances are different from each other and from the first distance, and wherein at least two of the vertical sensing electrodes in the third set of electrodes have different lengths along the height of the third column.

2. The touch sensor of claim 1, wherein at least one of the vertical sensing electrodes in the second set of electrodes is electrically connected to at least one corresponding vertical sensing electrode within the second area of the substrate, wherein the first and second areas of the substrate are non-overlapping.

3. The touch sensor of claim 1, wherein the horizontal sensing electrode is electrically disconnected with respect to the vertical sensing electrodes in the second and third sets of electrodes.

4. The touch sensor of claim 1, wherein:
the second area of the substrate is non-overlapping of and adjacent to the first area of the substrate; and
the corresponding horizontal sensing electrode in the second area of the substrate extends along a height of a fourth column within the second area of the substrate.

5. The touch sensor of claim 1, wherein:
the at least two vertical sensing electrodes that extend along the second column are physically separate with respect to each other, electrically separate with respect to each other, and electrically separate with respect to the horizontal sensing electrode and vertical sensing electrodes in the first and third columns within the first area of the substrate; and
two of the vertical sensing electrodes in the third column are electrically connected to each other, and are electrically separate with respect to the horizontal sensing electrode and vertical sensing electrodes in the first and second columns within the first area of the substrate.

6. The touch sensor of claim 1, wherein the corresponding horizontal sensing electrode or a separate vertical sensing electrode in the second area of the substrate extends through the first distance from a top edge of the second area of the substrate.

7. The touch sensor of claim 1, wherein:
a first vertical sensing electrode and a second vertical sensing electrode in the second column are physically and electrically separate with respect to each other; and
the first vertical sensing electrode is electrically connected to a corresponding vertical sensing electrode in a third area of the substrate that is adjacent to the first area of the substrate and electrically separate with respect to a corresponding vertical sensing electrode in the second area of the substrate that is adjacent to the first area of the substrate, wherein the second vertical sensing electrode is electrically connected to the corresponding vertical sensing electrodes in the second area of the substrate and the third area of the substrate.

8. The touch sensor of claim 1, wherein:
the second set of electrodes in the first area of the substrate comprises at least first and second vertical sensing electrodes that are physically separate with respect to each other; and
a set of electrodes in the second area of the substrate, that is adjacent to the first area of the substrate, comprises at least third and fourth vertical sensing electrodes in a column that are physically separate with respect to each other, wherein the first, second, third, and fourth vertical sensing electrodes are electrically disconnected with respect to each other, wherein the first and second vertical sensing electrodes are electrically connected to corresponding vertical sensing electrodes in a third area of the substrate that is adjacent to the first area of the substrate, and wherein the third and fourth vertical sensing electrodes are electrically connected to corresponding vertical sensing electrodes in a fourth area of the substrate that is adjacent to the second area of the substrate.

9. A projected capacitive touch sensor system, comprising:
- a substrate;
- at least a first set, a second set, and a third set of electrodes coupled to a first area of the substrate, wherein:
  - the first set of electrodes comprises a horizontal sensing electrode that extends along a height of a first column within the first area of the substrate;
  - the second set of electrodes comprises at least two vertical sensing electrodes that extend partially along a height of a second column within the first area of the substrate; and
  - the third set of electrodes comprises at least one electrode more than the second set of electrodes that extend partially along a height of a third column within the first area of the substrate, the third column comprising at least two vertical sensing electrodes that are physically separate with respect to each other and electrically connected to each other; and
- a controller configured to detect signal levels associated with at least one touch on the substrate from the first, second, and third sets of electrodes, the signal levels associated with the horizontal sensing electrode used to identify the first area of the substrate and the signal levels associated with the vertical sensing electrodes used to determine a vertical location within the first area of the substrate,
- wherein the horizontal sensing electrode in the first area of the substrate is electrically disconnected from a corresponding horizontal sensing electrode in a second area of the substrate,
- wherein two of the vertical sensing electrodes in the second set of electrodes are physically separated from each other at a first distance from a top edge of the first area of the substrate, and
- wherein the vertical sensing electrodes in the third set of electrodes are physically separated from each other at a set of distances from the top edge of the first area of the substrate, wherein distances in the set of distances are different from each other and from the first distance, and wherein at least two of the vertical sensing electrodes in the third set of electrodes have different lengths along the height of the third column.

10. The touch sensor system of claim 9, wherein the controller comprises:
- electronic channels, wherein the horizontal sensing electrode is connected to a different electronic channel than the corresponding horizontal sensing electrode.

11. The touch sensor system of claim 9, wherein the vertical location is determined based on one or more ratios of the signal levels associated with the vertical sensing electrodes.

12. The touch sensor system of claim 9, wherein the at least one touch is determined to be within the first area of the substrate based on the signal levels associated with the horizontal sensing electrode.

13. The touch sensor system of claim 9, wherein the vertical location is determined based on a size of the at least one touch.

14. The touch sensor system of claim 9, wherein the vertical location is determined based on interpolation.

15. The touch sensor system of claim 9, further comprising a fourth set of electrodes coupled to the first area of the substrate,
- wherein the fourth set of electrodes comprises at least one vertical sensing electrode more than the third set of electrodes that extend partially along a height of a fourth column within the first area of the substrate, the fourth column comprising at least two vertical sensing electrodes that are physically separate with respect to each other and electrically connected to each other, and
- wherein the vertical sensing electrodes in the fourth set of electrodes are physically separated from each other at another set of distances from the top edge of the first area of the substrate, wherein each of the distances in the another set of distances is different from each other and from each of the distances in the set of distances and from the first distance.

16. A method of controller operation of a projected capacitive touch sensor system, the projected capacitive touch sensor system comprising a controller, a substrate, and sets of electrodes coupled to one or more areas of the substrate, the sets of electrodes comprising a first set of at least two vertical sensing electrodes, a second set of at least three vertical sensing electrodes, and a horizontal sensing electrode, the method comprising:
- detecting signal levels associated with at least one touch on the substrate from the sets of electrodes;
- determining at least one area of the substrate of the at least one touch in accordance with the signal levels associated with the horizontal sensing electrode; and
- determining one or more vertical locations within the at least one area of the substrate of the at least one touch in accordance with the signal levels associated with the vertical sensing electrodes,
- wherein the horizontal sensing electrode extends along a height of a first column within a first area of the substrate;
- wherein the first set of at least two vertical sensing electrodes are physically separate with respect to each other and extend partially along a height of a second column within the first area of the substrate,
- wherein the second set of at least three vertical sensing electrodes extend partially along a height of a third column within the first area of the substrate, the second set of electrodes comprising at least two vertical sensing electrodes that are physically separate with respect to each other and electrically connected to each other,
- wherein two of the vertical sensing electrodes in the first set of at least two vertical sensing electrodes are physically separated from each other at a first distance from a top edge of the first area of the substrate,
- wherein vertical sensing electrodes in the second set of electrodes are physically separated from each other at a set of distances from the top edge of the first area of the substrate,
- wherein distances in the set of distances are different from each other and from the first distance, and
- wherein the horizontal sensing electrode in the first area of the substrate is electrically disconnected from a corresponding horizontal sensing electrode in a second area of the substrate, the first area and the second area of the substrate being non-overlapping with respect to each other, and wherein at least two of the vertical sensing electrodes in the second set of electrodes have different lengths along the height of the third column.

17. The method of claim 16, further comprising:
- determining the one or more vertical locations based on one or more ratios of the signal levels associated with the vertical sensing electrodes.

18. The method of claim 16, further comprising:
- identifying the first area of the substrate as corresponding to the at least one touch based on the signal levels associated with the horizontal sensing electrode.

19. The method of claim 16, further comprising:
determining the one or more vertical locations based on a size of the at least one touch.

20. The method of claim 16, further comprising:
determining the one or more vertical locations based on interpolation.

* * * * *